US011024235B2

(12) United States Patent
Feng et al.

(10) Patent No.: US 11,024,235 B2
(45) Date of Patent: Jun. 1, 2021

(54) SHIFT REGISTER UNIT, METHOD FOR DRIVING SHIFT REGISTER UNIT, GATE DRIVING CIRCUIT, AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Xuehuan Feng, Beijing (CN); Yongqian Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/633,068

(22) PCT Filed: Jul. 8, 2019

(86) PCT No.: PCT/CN2019/095108

§ 371 (c)(1),
(2) Date: Jan. 22, 2020

(87) PCT Pub. No.: WO2020/015547

PCT Pub. Date: Jan. 23, 2020

(65) Prior Publication Data

US 2020/0168162 A1 May 28, 2020

(30) Foreign Application Priority Data

Jul. 18, 2018 (CN) ........................ 201810792877.7

(51) Int. Cl.
*G09G 3/3266* (2016.01)
*G11C 19/28* (2006.01)

(52) U.S. Cl.
CPC ........... *G09G 3/3266* (2013.01); *G11C 19/28* (2013.01); *G09G 2310/0286* (2013.01); *G09G 2310/061* (2013.01); *G09G 2310/08* (2013.01)

(58) Field of Classification Search
CPC ......... G09G 2310/0286; G09G 3/3266; G09G 2310/08; G09G 2300/0465;
(Continued)

(56) References Cited

U.S. PATENT DOCUMENTS 8,817,943 B2 8/2014 Jang
9,779,665 B2 10/2017 Song et al.
(Continued)

FOREIGN PATENT DOCUMENTS

CN 103680634 A 3/2014
CN 103915058 A 7/2014
(Continued)

*Primary Examiner* — Hong Zhou
(74) *Attorney, Agent, or Firm* — Banner & Witcoff, Ltd.

(57) ABSTRACT

A shift register unit, a method for driving a shift register unit, a gate driving circuit, and a display device are provided. The shift register unit includes a blanking input circuit, a display input circuit, and an output circuit. The blanking input circuit is configured to, according to a blanking input signal and a blanking control signal, input a blanking pull-up signal to a first control node in a blanking period, and compensate the blanking input circuit; the display input circuit is configured to input a display pull-up signal to the first control node in a display period in response to a display input signal; and the output circuit is configured to output a composite output signal to an output terminal.

18 Claims, 14 Drawing Sheets

(58) Field of Classification Search

CPC ... G09G 2310/0267; G09G 2310/0283; G09G 2310/061; G09G 2320/0295; G09G 2330/08; G09G 3/3225; G09G 3/3648; G09G 3/3674; G09G 3/3677; G11C 19/28

See application file for complete search history.

(56) References Cited

U.S. PATENT DOCUMENTS

| | | | | |
|---|---|---|---|---|
| 2014/0176401 | A1* | 6/2014 | Kim | G09G 3/3208 345/76 |
| 2017/0108989 | A1* | 4/2017 | Gu | G06F 3/04184 |
| 2017/0162122 | A1 | 6/2017 | In | |
| 2017/0193885 | A1* | 7/2017 | Feng | G11C 19/184 |
| 2018/0337682 | A1* | 11/2018 | Takasugi | G09G 3/3241 |

FOREIGN PATENT DOCUMENTS

| | | | |
|---|---|---|---|
| CN | 104933990 | A | 9/2015 |
| CN | 106683617 | A | 5/2017 |
| CN | 109935185 | A | 6/2019 |
| KR | 20170078978 | A | 7/2017 |

* cited by examiner

SHIFT REGISTER UNIT, METHOD FOR DRIVING SHIFT REGISTER UNIT, GATE DRIVING CIRCUIT, AND DISPLAY DEVICE

The application is a U.S. National Phase Entry of International Application No. PCT/CN2019/095108 filed on Jul. 8, 2019, designating the United States of America and claiming priority to Chinese Patent Application No. 201810792877.7, filed on Jul. 18, 2018. The present application claims priority to and the benefit of the above-identified applications and the above-identified applications are incorporated by reference herein in their entirety.

TECHNICAL FIELD

Embodiments of the present disclosure relate to a shift register unit, a method for driving a shift register unit, a gate driving circuit, and a display device.

BACKGROUND

In a field of display technology, for example, a pixel array of a liquid crystal display panel or an organic light emitting diode (OLED) display panel generally comprises a plurality of rows of gate lines and a plurality of columns of data lines interleaved with the plurality of rows of gate lines. The gate lines can be driven by a gate driving circuit. The gate driving circuit is usually integrated in a gate drive chip (Gate IC).

SUMMARY

At least one embodiment of the present disclosure provides a shift register unit, which comprises a blanking input circuit, a display input circuit, and an output circuit. The blanking input circuit is configured to, according to a blanking input signal and a blanking control signal, input a blanking pull-up signal to a first control node in a blanking period, and compensate the blanking input circuit; the display input circuit is configured to input a display pull-up signal to the first control node in a display period in response to a display input signal; and the output circuit is configured to output a composite output signal to an output terminal under control of a level of the first control node.

For example, the shift register unit provided by an embodiment of the present disclosure further includes a noise reduction circuit and a first control circuit; the noise reduction circuit is configured to perform noise reduction on the first control node and the output terminal under control of a level of a second control node; and the first control circuit is configured to control the level of the second control node under control of the level of the first control node.

For example, in the shift register unit provided by an embodiment of the present disclosure, the blanking input circuit comprises: a charging sub-circuit, configured to input the blanking input signal to a first node in response to the blanking control signal; a compensation sub-circuit, configured to store the blanking input signal input by the charging sub-circuit, compensate a level of the first node in response to a first clock signal, and perform coupling control on a level of a second node; and an isolation sub-circuit, configured to input the blanking pull-up signal to the first control node under control of the level of the second node.

For example, in the shift register unit provided by an embodiment of the present disclosure, the blanking input circuit further comprises a control sub-circuit, and the control sub-circuit is configured to control the level of the second node under control of the level of the second control node.

For example, in the shift register unit provided by an embodiment of the present disclosure, the charging sub-circuit comprises a first transistor, a gate electrode of the first transistor is connected to a random signal terminal to receive a random signal which serves as the blanking control signal, a first electrode of the first transistor is connected to a blanking input signal terminal to receive the blanking input signal, and a second electrode of the first transistor is connected to the first node; the compensation sub-circuit comprises a second transistor and a first capacitor, a gate electrode of the second transistor is connected to the first node, a first electrode of the second transistor is connected to a first clock signal terminal to receive the first clock signal, a second electrode of the second transistor is connected to the second node, a first electrode of the first capacitor is connected to the first node, and a second electrode of the first capacitor is connected to the second node; the isolation sub-circuit comprises a third transistor, a gate electrode of the third transistor is connected to the second node, a first electrode of the third transistor is connected to a first voltage terminal to receive a first voltage which serves as the blanking pull-up signal, and a second electrode of the third transistor is connected to the first control node; and the control sub-circuit comprises a fourth transistor, a gate electrode of the fourth transistor is connected to the second control node, a first electrode of the fourth transistor is connected to the second node, and a second electrode of the fourth transistor is connected to a second voltage terminal to receive a second voltage.

For example, in the shift register unit provided by an embodiment of the present disclosure, the display input circuit comprises a fifth transistor; and a gate electrode of the fifth transistor is connected to a display input signal terminal to receive the display input signal, a first electrode of the fifth transistor is connected to a first voltage terminal to receive a first voltage which serves as the display pull-up signal, and a second electrode of the fifth transistor is connected to the first control node.

For example, in the shift register unit provided by an embodiment of the present disclosure, the output circuit comprises at least one shift signal output terminal and at least one pixel scanning signal output terminal.

For example, in the shift register unit provided by an embodiment of the present disclosure, the output circuit comprises a sixth transistor, a seventh transistor, and a second capacitor; a gate electrode of the sixth transistor is connected to the first control node, a first electrode of the sixth transistor is connected to a second clock signal terminal to receive a second clock signal which serves as the composite output signal, and a second electrode of the sixth transistor is connected to the shift signal output terminal; a gate electrode of the seventh transistor is connected to the first control node, a first electrode of the seventh transistor is connected to the second clock signal terminal to receive the second clock signal which serves as the composite output signal, and a second electrode of the seventh transistor is connected to the pixel scanning signal output terminal; and a first electrode of the second capacitor is connected to the first control node, and a second electrode of the second capacitor is connected to the second electrode of the sixth transistor or the second electrode of the seventh transistor.

For example, in the shift register unit provided by an embodiment of the present disclosure, the noise reduction circuit comprises an eighth transistor, a ninth transistor, and a tenth transistor; a gate electrode of the eighth transistor is connected to the second control node, a first electrode of the eighth transistor is connected to the first control node, and a second electrode of the eighth transistor is connected to a third voltage terminal to receive a third voltage; a gate electrode of the ninth transistor is connected to the second control node, a first electrode of the ninth transistor is connected to the shift signal output terminal, and a second electrode of the ninth transistor is connected to the third voltage terminal to receive the third voltage; and a gate electrode of the tenth transistor is connected to the second control node, a first electrode of the tenth transistor is connected to the pixel scanning signal output terminal, and a second electrode of the tenth transistor is connected to a fourth voltage terminal to receive a fourth voltage.

For example, in the shift register unit provided by an embodiment of the present disclosure, the first control circuit comprises an eleventh transistor, a twelfth transistor, and a thirteenth transistor; a gate electrode of the eleventh transistor is connected to a first electrode of the eleventh transistor, and is connected to a fifth voltage terminal to receive a fifth voltage, and a second electrode of the eleventh transistor is connected to the second control node; a gate electrode of the twelfth transistor is connected to a first electrode of the twelfth transistor, and is connected to a sixth voltage terminal to receive a sixth voltage, and a second electrode of the twelfth transistor is connected to the second control node; and a gate electrode of the thirteenth transistor is connected to the first control node, a first electrode of the thirteenth transistor is connected to the second control node, and a second electrode of the thirteenth transistor is connected to a third voltage terminal to receive a third voltage.

For example, the shift register unit provided by an embodiment of the present disclosure further includes a blanking reset circuit, and the blanking reset circuit is configured to reset the first control node in response to a blanking reset signal.

For example, in the shift register unit provided by an embodiment of the present disclosure, the blanking reset circuit comprises a fourteenth transistor; and a gate electrode of the fourteenth transistor is connected to a blanking reset signal terminal to receive the blanking reset signal, a first electrode of the fourteenth transistor is connected to the first control node, and a second electrode of the fourteenth transistor is connected to a third voltage terminal to receive a third voltage.

For example, the shift register unit provided by an embodiment of the present disclosure further includes a display reset circuit, and the display reset circuit is configured to reset the first control node in response to a display reset signal.

For example, in the shift register unit provided by an embodiment of the present disclosure, the display reset circuit includes a fifteenth transistor; and a gate electrode of the fifteenth transistor is connected to a display reset signal terminal to receive the display reset signal, a first electrode of the fifteenth transistor is connected to the first control node, and a second electrode of the fifteenth transistor is connected to a third voltage terminal to receive a third voltage.

For example, the shift register unit provided by an embodiment of the present disclosure further includes a second control circuit, and the second control circuit is configured to control the level of the second control node in response to a first clock signal or the display input signal.

For example, in the shift register unit provided by an embodiment of the present disclosure, the second control circuit comprises a sixteenth transistor and a seventeenth transistor; a gate electrode of the sixteenth transistor is connected to a first clock signal terminal to receive the first clock signal, a first electrode of the sixteenth transistor is connected to the second control node, and a second electrode of the sixteenth transistor is configured to receive a third voltage of a third voltage terminal; and a gate electrode of the seventeenth transistor is connected to a display input signal terminal to receive the display input signal, a first electrode of the seventeenth transistor is connected to the second control node, and a second electrode of the seventeenth transistor is connected to the third voltage terminal to receive the third voltage.

At least one embodiment of the present disclosure also provides a gate driving circuit, which includes the shift register unit according to any one of the embodiments of the present disclosure.

For example, in the gate driving circuit provided by an embodiment of the present disclosure, each four shift register units share a same charging sub-circuit, a same compensation sub-circuit, and a same control sub-circuit, a random signal terminal of a (4n−3)th shift register unit is connected to a random signal line, a first clock signal terminal of the (4n−3)th shift register unit is connected to a first clock line, and n is an integer greater than zero.

For example, the gate driving circuit provided by an embodiment of the present disclosure further includes a first sub-clock signal line, a second sub-clock signal line, a third sub-clock signal line, and a fourth sub-clock signal line. A second clock signal terminal of the (4n−3)th shift register unit is connected to the first sub-clock signal line; a second clock signal terminal of a (4n−2)th shift register unit is connected to the second sub-clock signal line; a second clock signal terminal of a (4n−1)th shift register unit is connected to the third sub-clock signal line; a second clock signal terminal of a (4n)th shift register unit is connected to the fourth sub-clock signal line; and n is an integer greater than zero.

For example, in the gate driving circuit provided by an embodiment of the present disclosure, a blanking input signal terminal of an (n+1)th shift register unit is connected to a shift signal output terminal of an (n)th shift register unit; a display input signal terminal of an (n+2)th shift register unit is connected to the shift signal output terminal of the (n)th shift register unit; a display reset signal terminal of the (n)th shift register unit is connected to a shift signal output terminal of an (n+3)th shift register unit; and n is an integer greater than zero.

At least one embodiment of the present disclosure also provides a display device, which includes the shift register unit according to any one of the embodiments of the present disclosure or the gate driving circuit according to any one of the embodiments of the present disclosure.

At least one embodiment of the present disclosure also provides a method for driving the shift register unit according to any one of the embodiments of the present disclosure, and the method includes a display period and a blanking period for processing one frame of image. The display period comprises: in a first input phase, inputting the display pull-up signal to the first control node in response to the display input signal by the display input circuit; and in a first output phase, outputting the composite output signal to the output terminal under control of the level of the first control node by the output circuit. The blanking period comprises: in a second input phase, by the blanking input circuit, inputting the blanking pull-up signal to the first control node, according to the blanking input signal and the blanking control signal, and compensating the blanking input circuit; and in a second output phase, outputting the composite output signal to the output terminal under control of the level of the first control node by the output circuit.

BRIEF DESCRIPTION OF THE DRAWINGS

In order to clearly illustrate the technical solutions of the embodiments of the present disclosure, the drawings of the embodiments will be briefly described in the following; and it is obvious that the described drawings are only related to some embodiments of the present disclosure and thus are not limitative to the present disclosure.

DETAILED DESCRIPTION

Figure 1:
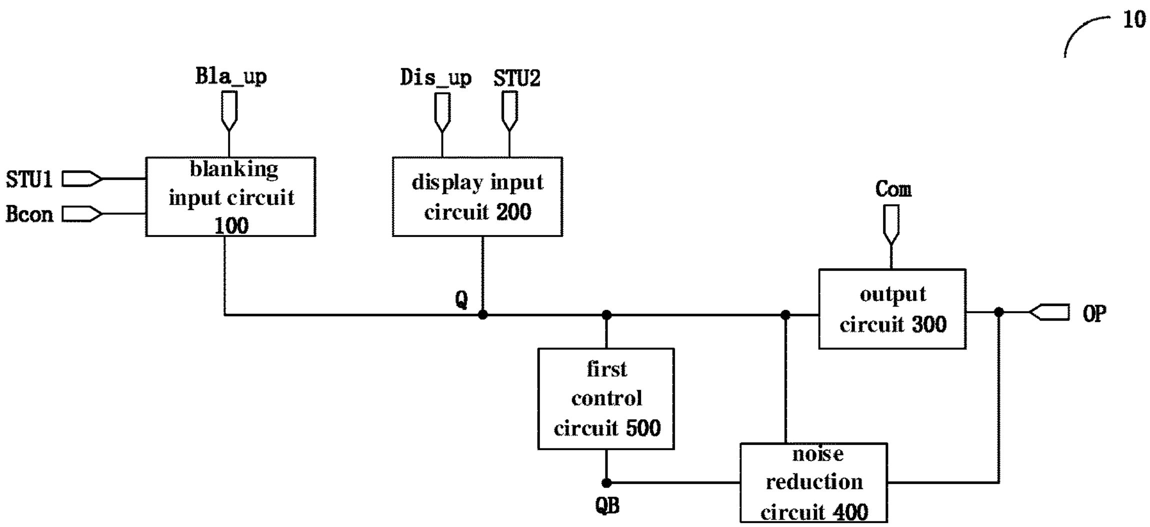
FIG. 1 is a schematic block diagram of a shift register unit provided by some embodiments of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

In general OLED display panels, compensation technology is required to improve display quality. In a case of compensating sub-pixel units in an OLED display panel, in addition to setting a pixel compensation circuit in the sub-pixel unit to perform internal compensation, external compensation can also be performed by setting a sensing transistor. In a case of performing the external compensation, a gate driving circuit including shift register units needs to provide a driving signal for a scanning transistor and a driving signal for the sensing transistor to the sub-pixel unit in the display panel, respectively. For example, a scanning driving signal (i.e., a display output signal) for the scanning transistor is provided in a display period of one frame, and a sensing driving signal (i.e., a blanking output signal) for the sensing transistor is provided in a blanking period of one frame.

In IC design, a chip area is a main factor that affects chip cost. How to effectively reduce the chip area is a problem that technical developers need to consider emphatically. In an OLED display panel, a shift register unit of a gate driving circuit generally includes a sense unit, a scan unit, and a connection unit (or gate circuit or Hiz circuit) that outputs a composite pulse of a pulse of the sense unit and a pulse of the scan unit. With the circuit structure including the above three parts, the shift register unit can output an output pulse of a composite waveform including two waveforms with different widths and timings, thereby providing a display output signal for the scanning transistor and a blanking output signal for the sensing transistor, respectively. However, a circuit structure of the shift register unit is complex, and a size of the shift register unit is large, which is not conducive to realizing high resolution and narrow frame, nor is it conducive to reducing the chip area to reduce cost.

In order to further reduce the size of the shift register unit and the size of the gate driving circuit including the shift register unit, for example, the sense unit, the scan unit and the connection unit may be integrated so that the blanking output signal in the blanking period and the display output signal in the display period of one frame of image are output through a same output circuit, thereby simplifying the circuit structure. However, in the integrated circuit, in a case of performing level control (e.g., pull-up) on a first control node (e.g., a pull-up node) during the blanking period, because the function is realized by a circuit including a plurality of transistors, there is a large threshold voltage loss, which affects a potential of the pull-up node, e.g., the potential of the pull-up node cannot reach a predetermined high potential, and further affects the output of the blanking output signal. In addition, the gate driving circuit generally uses sequential scanning for external compensation, but long-term row-by-row compensation may cause some problems, for example, there is a scanning line which moves row-by-row in the display process, and the brightness difference in different regions is large due to the difference in compensation time.

At least one embodiment of the present disclosure provides a shift register unit, a method for driving a shift register unit, a gate driving circuit, and a display device. A circuit structure of the shift register unit is simple, which can alleviate the threshold voltage loss in a case where the blanking input circuit performs level control (e.g., pull-up) on the first control node (e.g., the pull-up node) in the blanking period, avoid affecting the potential of the first control node, and thus improve the accuracy of the blanking output signal.

Embodiments of the present disclosure are described in detail below with reference to the accompanying drawings. It should be noted that the same reference numerals in different drawings are used to refer to the same elements already described.

At least one embodiment of the present disclosure provides a shift register unit. The shift register unit includes a blanking input circuit, a display input circuit, and an output circuit. The blanking input circuit is configured to, according to a blanking input signal and a blanking control signal, input a blanking pull-up signal to a first control node in a blanking period, and compensate the blanking input circuit; the display input circuit is configured to input a display pull-up signal to the first control node in a display period in response to a display input signal; and the output circuit is configured to output a composite output signal to an output terminal under control of a level of the first control node.

FIG. 1 is a schematic block diagram of a shift register unit provided by some embodiments of the present disclosure. Referring to FIG. 1, a shift register unit 10 includes a blanking input circuit 100, a display input circuit 200, and an output circuit 300. For example, in some examples, the shift register unit 10 further includes a noise reduction circuit 400 and a first control circuit 500. A plurality of the shift register units 10 can be cascaded to construct a gate driving circuit provided by any one of the embodiments of the present disclosure.

The blanking input circuit 100 is configured to, according to a blanking input signal and a blanking control signal, input a blanking pull-up signal to a first control node (e.g., a pull-up node Q) in a blanking period, and compensate the blanking input circuit 100. For example, the blanking input circuit 100 is electrically connected to a blanking input signal terminal STU1, a blanking control signal terminal Bcon, a blanking pull-up signal terminal Bla_up, and the pull-up node Q. For example, the blanking input circuit 100 further includes a first node N1 and a second node N2 (not illustrated in FIG. 1). The blanking input circuit 100 charges the first node N1 in response to the blanking input signal provided by the blanking input signal terminal STU1 and the blanking control signal provided by the blanking control signal terminal Bcon, compensates a level of the first node N1, and performs coupling control on a level of the second node N2. Therefore, under control of the level of the second node N2, the blanking pull-up signal provided by the blanking pull-up signal terminal Bla_up is input to the pull-up node Q, so as to charge the pull-up node Q to be at a high level.

It should be noted that in the embodiments of the present disclosure, the blanking input circuit 100 is provided in the shift register unit 10 to realize that the blanking output signal can be output in the blanking period of one frame. The "blanking" in the blanking input circuit 100 only represents that the circuit is related to the blanking period, and it is not limited that the circuit only works in the blanking period. The above case may also be applied to the following respective embodiments, and is not described again. For example, the blanking input circuit 100 charges the first node N1 during the display period and keeps the high level of the first node N1 to the blanking period; and the blanking input circuit 100 compensates the level of the first node N1 during the blanking period, performs coupling control on the level of the second node N2, and charges the pull-up node Q to be at a high level.

For example, the blanking input circuit 100 can be implemented as a plurality of transistors. In the process of charging the pull-up node Q, by compensating the level of the first node N1 and performing coupling control on the level of the second node N2, the threshold voltage loss generated by the plurality of transistors can be compensated so that the level of the second node N2 reaches a predetermined value (e.g., a predetermined high level), thereby enabling the level of the pull-up node Q to reach a predetermined value (e.g., a predetermined high level) under control of the level of the second node N2, so as to avoid the threshold voltage loss from affecting the level of the pull-up node Q.

For example, a random signal may be used as the blanking control signal. For example, the random signal is provided by a random signal generation circuit (e.g., a FPGA) separately provided. In a case where a plurality of shift register units 10 are cascaded to form a gate driving circuit, the random signal provided to the gate driving circuit is not a time sequence of line-by-line scanning, but is random or according to other regular time sequences, thereby realizing a random detection function, i.e., any row of pixel circuits can be compensated and detected in any frame. Therefore, in a case where the gate driving circuit outputs the blanking output signal under control of the random signal to perform the external compensation to the pixel circuit, scanning lines and brightness deviations appearing in a screen can be eliminated by the random detection function.

The display input circuit 200 is configured to input a display pull-up signal to the first control node (e.g., the pull-up node Q) in a display period in response to a display input signal. For example, the display input circuit 200 is electrically connected to a display input signal terminal STU2, a display pull-up signal terminal Dis_up, and the pull-up node Q, and is configured to be turned on under control of the display input signal provided by the display input signal terminal STU2, to electrically connected the display pull-up signal terminal Dis_up and the pull-up node Q, so that the display pull-up signal provided by the display pull-up signal terminal Dis_up is input to the pull-up node Q, and the pull-up node Q is pulled up to a high level.

The output circuit 300 is configured to output a composite output signal to an output terminal OP under control of the level of the first control node (e.g., the pull-up node Q). For example, the output circuit 300 is electrically connected to the pull-up node Q, a composite output signal terminal Com, and the output terminal OP, and is configured to be turned on under control of the level of the pull-up node Q, so that the composite output signal provided by the composite output signal terminal Com is output to the output terminal OP. For example, the output signal of the output terminal OP may include a display output signal and a blanking output signal, and the display output signal and the blanking output signal may be two mutually independent waveforms having different widths and timings. For example, in the display period, the output circuit 300 outputs the display output signal via the output terminal OP under control of the level of the pull-up node Q, so as to drive the scanning transistor in the pixel unit to perform display; and in the blanking period, the output circuit 300 outputs the blanking output signal via the output terminal OP under control of the level of the pull-up node Q, so as to drive the sensing transistor in the pixel unit, thereby performing compensation detection function.

The noise reduction circuit 400 is configured to perform noise reduction on the first control node (e.g., the pull-up node Q) and the output terminal OP under control of a level of a second control node (e.g., a pull-down node QB). For example, the noise reduction circuit 400 is connected to the pull-down node QB, the pull-up node Q, and the output terminal OP, and is configured to electrically connect the pull-up node Q and the output terminal OP with a voltage terminal (e.g., a low voltage terminal) separately provided under control of a level of the pull-down node QB, thereby pulling down the pull-up node Q and the output terminal OP to a non-operating level (e.g., a low level) to realize noise reduction.

The first control circuit 500 is configured to control the level of the second control node (e.g., the pull-up node QB) under control of the level of the first control node (e.g., the pull-up node Q). For example, the first control circuit 500 is electrically connected to the pull-up node Q and the pull-down node QB, and is configured to pull down the pull-down node QB to a low level in a case where the pull-up node Q is at a high level, and pull up the pull-down node QB to a high level in a case where the pull-up node Q is at a low level. For example, the first control circuit 500 may be an inverting circuit.

Figure 2:
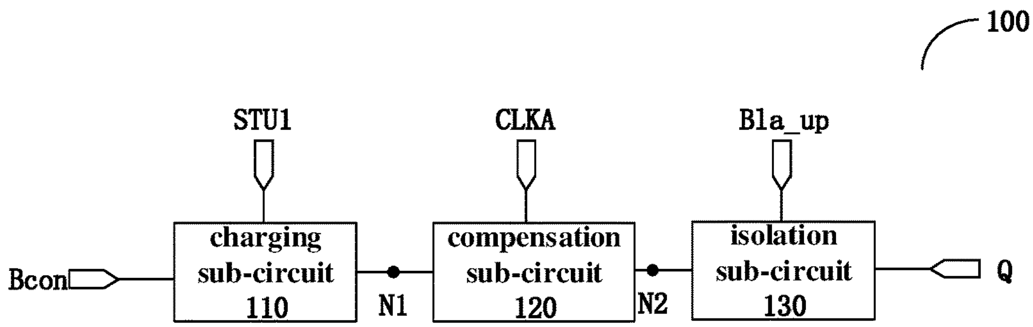
FIG. 2 is a schematic block diagram of a blanking input circuit of a shift register unit provided by some embodiments of the present disclosure.

FIG. 2 is a schematic block diagram of a blanking input circuit of a shift register unit provided by some embodiments of the present disclosure. Referring to FIG. 2, the blanking input circuit 100 includes a charging sub-circuit 110, a compensation sub-circuit 120, and an isolation sub-circuit 130.

The charging sub-circuit 110 is configured to input the blanking input signal to the first node N1 in response to the blanking control signal. For example, the charging sub-circuit 110 is connected to the blanking input signal terminal STU1, the blanking control signal terminal Bcon and the first node N1, and is configured to be turned on under control of the blanking control signal provided by the blanking control signal terminal Bcon, so that the blanking input signal terminal STU1 and the first node N1 are electrically connected, thereby inputting the blanking input signal to the first node N1. For example, in some examples, the charging sub-circuit 110 is turned on under control of the blanking control signal, and the blanking input signal is at a high level at this time, thereby charging the first node N1 and pulling up the first node N1 to a high level.

The compensation sub-circuit 120 is configured to store the blanking input signal input from the charging sub-circuit 110, compensate the level of the first node N1 in response to a first clock signal, and perform coupling control on the level of the second node N2. For example, the compensation sub-circuit 120 is connected to the first node N1, the second node N2, and a first clock signal terminal CLKA, and is configured to store the blanking input signal written into the first node N1, and compensate the level of the first node N1 (e.g., further pulling up the level of the first node N1 to a first level) in a case where a level of the first clock signal provided by the first clock signal terminal CLKA changes (e.g., changes from a low level to a high level), thereby performing coupling control on the level of the second node N2. For example, the compensation sub-circuit 120 is sufficiently turned on under control of the first level of the first node N1, so that the first clock signal is sufficiently written into the second node N2. For example, in some examples, because the first clock signal is sufficiently written into the second node N2, the level of the second node N2 is equal to the high level of the first clock signal at this time, that is, the level of the second node N2 reaches a predetermined value. Of course, the embodiments of the present disclosure are not limited to this case, and the level of the second node N2 may be slightly lower than the high level of the first clock signal as long as the isolation sub-circuit 130 can be controlled to be turned on or sufficiently turned on.

The isolation sub-circuit 130 is configured to input the blanking pull-up signal to the first control node (e.g., the pull-up node Q) under control of the level of the second node N2. For example, the isolation sub-circuit 130 is connected to the second node N2, the pull-up node Q, and the blanking pull-up signal terminal Bla_up, and is configured to be turned on under control of the level of the second node N2 to electrically connect the blanking pull-up signal terminal Bla_up and the pull-up node Q, thereby inputting the blanking pull-up signal provided by the blanking pull-up signal terminal Bla_up to the pull-up node Q. For example, in some examples, the isolation sub-circuit 130 is turned on under control of the level of the second node N2, and the blanking pull-up signal is at a high level at this time, thereby charging the pull-up node Q and pulling up the pull-up node Q to a high level. For example, under the function of the compensation sub-circuit 120, the level of the second node N2 reaches a predetermined value, so that the isolation sub-circuit 130 is sufficiently turned on, the high level of the blanking pull-up signal is sufficiently written into the pull-up node Q, and then the level of the pull-up node Q reaches a predetermined value.

In this way, the threshold voltage loss in a case where the blanking input circuit 100 pulls up the pull-up node Q in the blanking period can be alleviated, and the potential of the pull-up node Q can be prevented from being influenced, thereby improving the accuracy of the blanking output signal.

Figure 3:
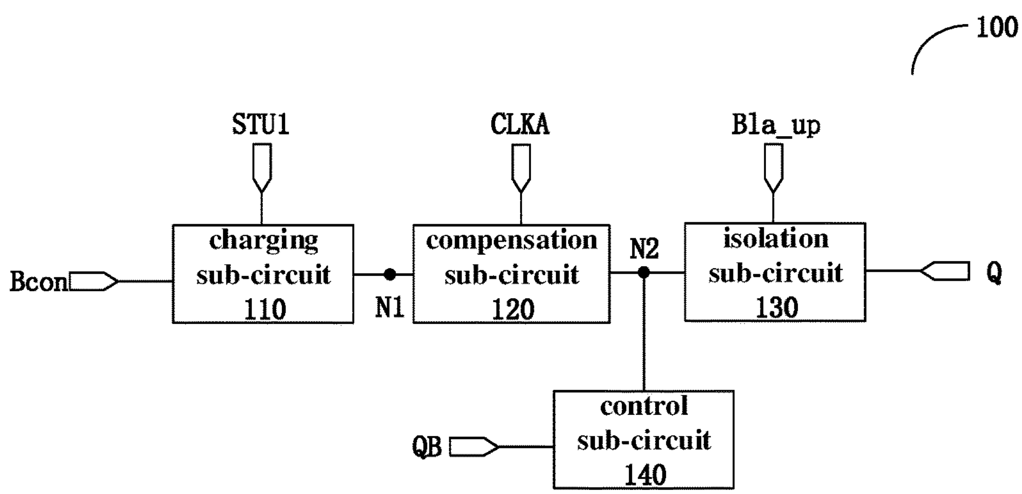
FIG. 3 is a schematic block diagram of a blanking input circuit of another shift register unit provided by some embodiments of the present disclosure.

FIG. 3 is a schematic block diagram of a blanking input circuit of another shift register unit provided by some embodiments of the present disclosure. Referring to FIG. 3, the blanking input circuit 100 in this embodiment further includes a control sub-circuit 140, and other structures are basically the same as the blanking input circuit 100 as illustrated in FIG. 2. The control sub-circuit 140 is configured to control (e.g., pull down) the level of the second node N2 under control of the level of the second control node (e.g., the pull down node QB). For example, the control sub-circuit 140 is connected to the second node N2 and the pull-down node QB, and is configured to be turned on under control of the level of the pull-down node QB to electrically connect the second node N2 to a voltage terminal (e.g., a low voltage terminal) provided separately, thereby pulling down the second node N2 to a low level. It should be noted that in the embodiments of the present disclosure, the control sub-circuit 140 is not limited to being connected to the pull-down node QB, but may also be connected to a separately provided clock signal terminal or other suitable signal terminal, so as to pull down the second node N2 under control of the clock signal or other suitable signal.

By setting the control sub-circuit 140, it can be ensured that the second node N2 is always kept at a low level in a case where the second node N2 needs to be at a low level, thereby ensuring that the isolation sub-circuit 130 is turned off and avoiding the blanking pull-up signal from affecting the pull-up node Q. For example, in some examples, during the display period, the second node N2 is pulled down by the control sub-circuit 140 to prevent the blanking pull-up signal from affecting the potential of the pull-up node Q, thereby realizing the normal display function.

It should be noted that in the embodiments of the present disclosure, the blanking input circuit 100 may include any suitable sub-circuit, and the blanking input circuit 100 is not limited to include the charging sub-circuit 110, the compensation sub-circuit 120, the isolation sub-circuit 130 and the control sub-circuit 140 mentioned above, as long as corresponding functions can be realized.

Figure 4:
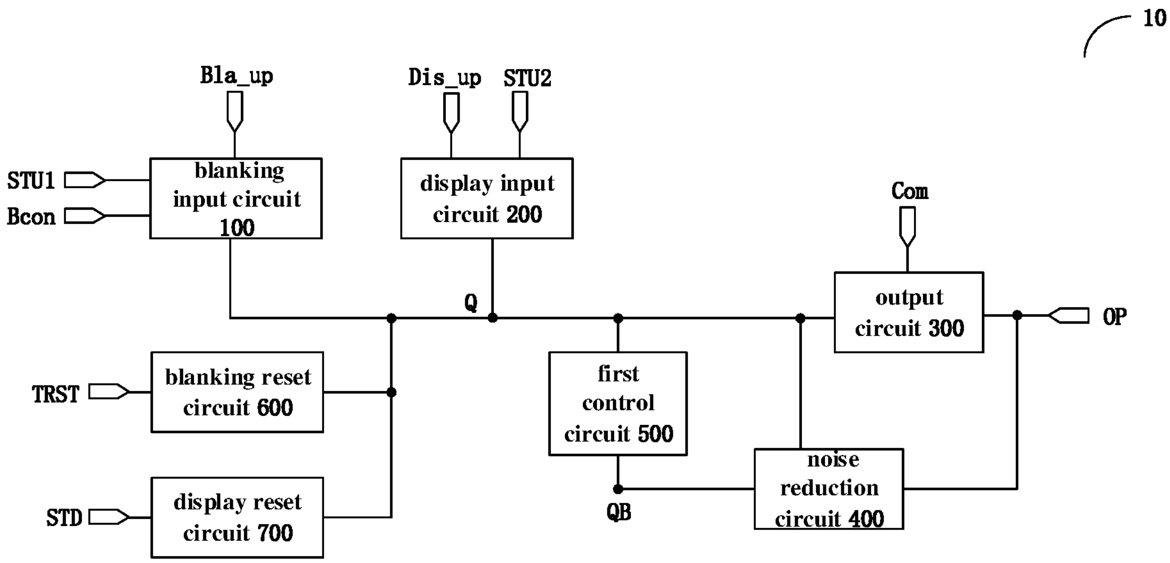
FIG. 4 is a schematic block diagram of another shift register unit provided by some embodiments of the present disclosure.

FIG. 4 is a schematic block diagram of another shift register unit provided by some embodiments of the present disclosure. Referring to FIG. 4, the shift register unit 10 in this embodiment further includes a blanking reset circuit 600 and a display reset circuit 700, and other structures are basically the same as the structures of the shift register unit 10 as illustrated in FIG. 1.

The blanking reset circuit 600 is configured to reset the first control node (e.g., the pull-up node Q) in response to a blanking reset signal. For example, the blanking reset circuit 600 is connected to a blanking reset signal terminal TRST and the pull-up node Q, and is configured to be turned on under control of the blanking reset signal provided by the blanking reset signal terminal TRST, so that the pull-up node Q is electrically connected to a voltage terminal (e.g., a low voltage terminal) provided separately, thereby resetting the pull-up node Q. For example, in the blanking period, in a case where the output circuit 300 completes the signal output, the pull-up node Q is reset by the blanking reset circuit 600. It should be noted that in the embodiments of the present disclosure, the "blanking" in the blanking reset circuit 600 only represents that the circuit is related to the blanking period, and it is not limited that the circuit only works in the blanking period. The following embodiments are the same as the above and it is not described again.

The display reset circuit 700 is configured to reset the first control node (e.g., the pull-up node Q) in response to a display reset signal. For example, the display reset circuit 700 is connected to a display reset signal terminal STD and the pull-up node Q, and is configured to be turned on under control of the display reset signal provided by the display reset signal terminal STD, so that the pull-up node Q is electrically connected to a voltage terminal (e.g., a low voltage terminal) provided separately, thereby resetting the pull-up node Q. For example, in the display period, in a case where the output circuit 300 completes the signal output, the pull-up node Q is reset by the display reset circuit 700.

Figure 5:
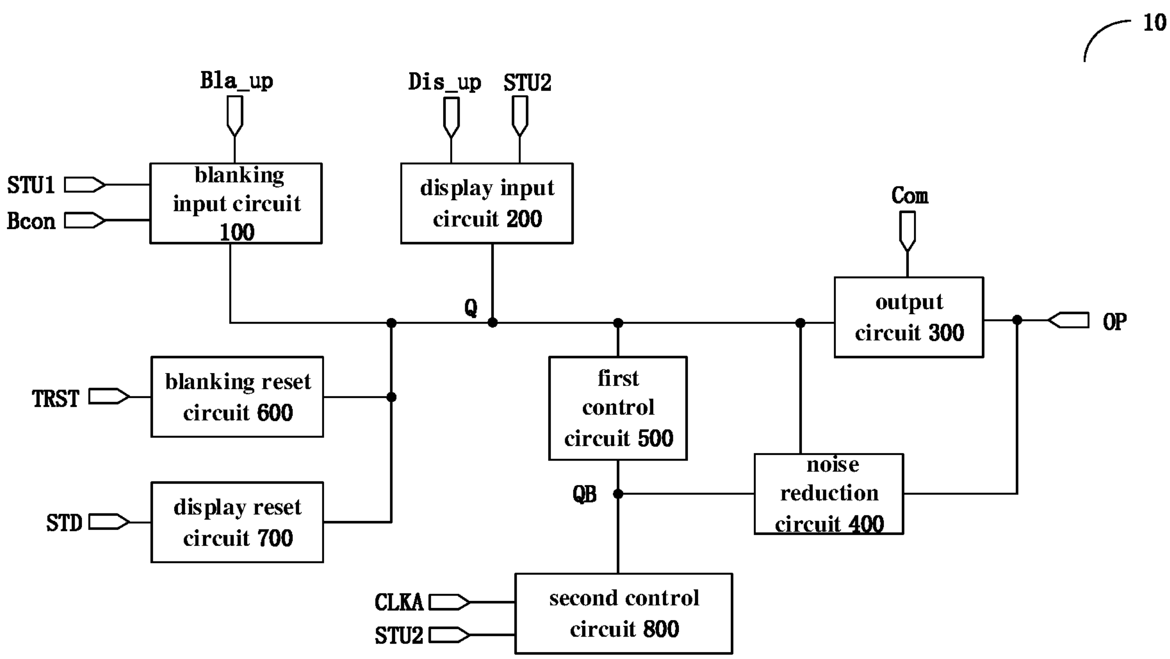
FIG. 5 is a schematic block diagram of another shift register unit provided by some embodiments of the present disclosure.

FIG. 5 is a schematic block diagram of another shift register unit provided by some embodiments of the present disclosure. Referring to FIG. 5, the shift register unit 10 in this embodiment further includes a second control circuit 800, and other structures are basically the same as the shift register unit 10 as illustrated in FIG. 4. The second control circuit 800 is configured to control the level of the second control node (e.g., pull-down node QB) in response to the first clock signal or the display input signal. For example, the second control circuit 800 is connected to the first clock signal terminal CLKA, the display input signal terminal STU2, and the pull-down node QB, and is configured to be turned on under control of the first clock signal provided by the first clock signal terminal CLKA or the display input signal provided by the display input signal terminal STU2, so that the pull-down node QB is electrically connected to a voltage terminal (e.g., a low voltage terminal) provided separately, thereby pulling down the pull-down node QB to a low level.

For example, in the blanking period, the second control circuit 800 pulls down the pull-down node QB in response to the first clock signal; and in the display period, the second control circuit 800 pulls down the pull-down node QB in response to the display input signal. Of course, the embodiments of the present disclosure are not limited to this case, and the second control circuit 800 may pull down the pull-down node QB only in the blanking period or only in the display period. By setting the second control circuit 800, the pull-down node QB can be ensured to be at a low level, which is helpful for the blanking input circuit 100 or the display input circuit 200 to write a high level into the pull-up node Q, so that the level of the pull-up node Q reaches a predetermined value, thereby preventing a threshold voltage of a transistor from drifting to affect the output signal, and enhancing the reliability of the circuit.

Figure 6:
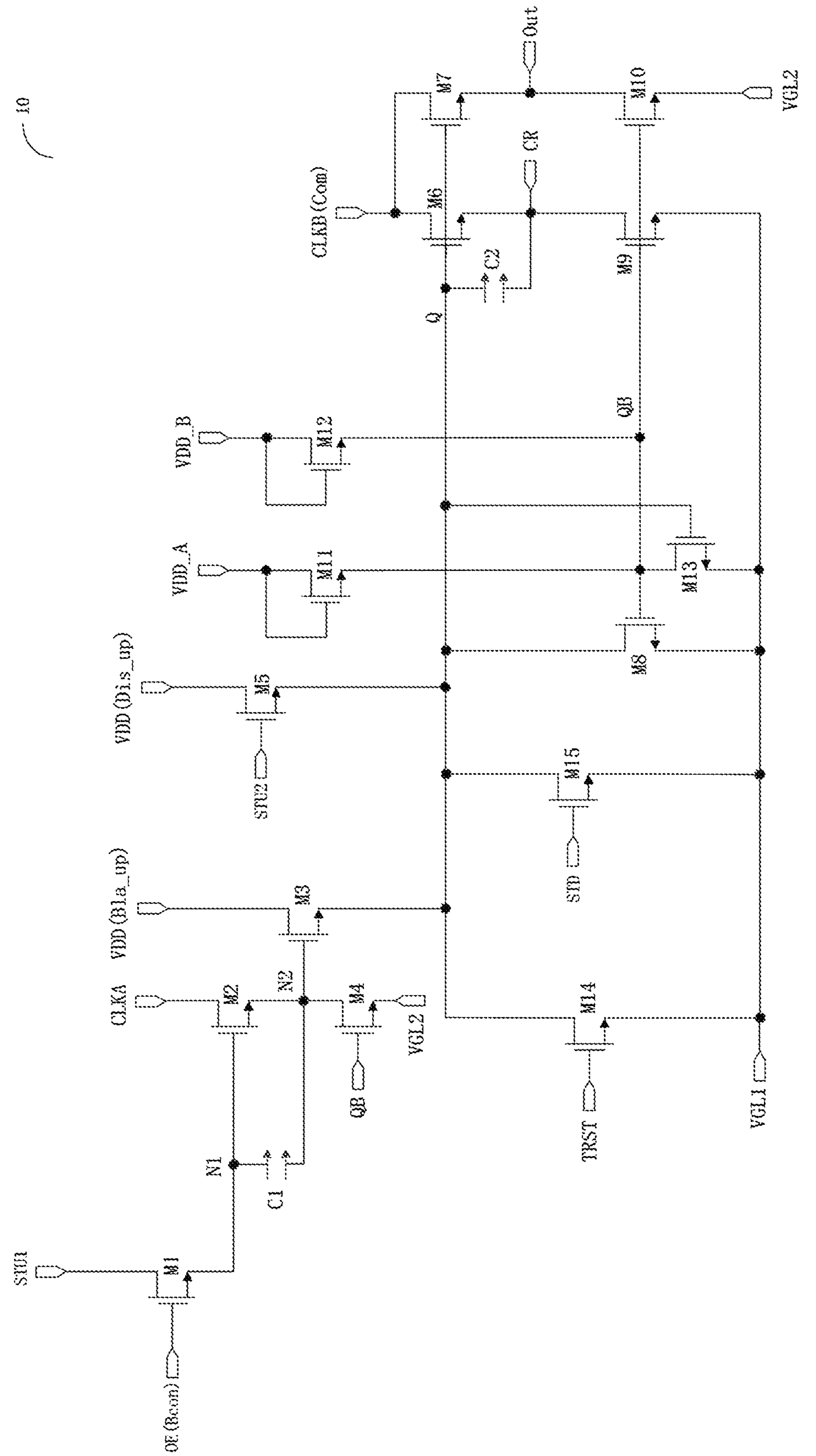
FIG. 6 is a circuit diagram of a specific implementation example of the shift register unit as illustrated in FIG. 4.

FIG. 6 is a circuit diagram of a specific implementation example of the shift register unit as illustrated in FIG. 4. The following description is illustrated by taking a case that each transistor is an N-type transistor as an example, but the embodiments of the present disclosure are not limited to this case.

Referring to FIG. 6, the shift register unit 10 includes first to fifteenth transistors M1-M15, and further includes a first capacitor C1 and a second capacitor C2.

The blanking input circuit 100 includes the charging sub-circuit 110, the compensation sub-circuit 120, the isolation sub-circuit 130, and the control sub-circuit 140. The charging sub-circuit 110 may be implemented as a first transistor M1. A gate electrode of the first transistor M1 is connected to a random signal terminal OE to receive a random signal (here, the random signal terminal OE serves as the aforementioned blanking control signal terminal Bcon and the random signal serves as the aforementioned blanking control signal), a first electrode of the first transistor M1 is connected to the blanking input signal terminal STU1 to receive the blanking input signal, and a second electrode of the first transistor M1 is connected to the first node N1. In a case where the random signal is at an effective level (e.g., a high level), the first transistor M1 is turned on, thereby writing the blanking input signal into the first node N1. For example, at this time, the blanking input signal is at a high level to charge the first node N1.

The compensation sub-circuit 120 may be implemented as a second transistor M2 and a first capacitor C1. A gate electrode of the second transistor M2 is connected to the first node N1, a first electrode of the second transistor M2 is connected to the first clock signal terminal CLKA to receive the first clock signal, and a second electrode of the second transistor M2 is connected to the second node N2. A first electrode of the first capacitor C1 is connected to the first node N1, and a second electrode of the first capacitor C1 is connected to the second node N2. In a case where the blanking input signal is written into the first node N1, the first node N1 is charged to a high level, and the first capacitor C1 stores the high level and maintains the first node N1 at a high level for use in a subsequent phase. Then, the second transistor M2 is turned on to write the first clock signal into the second node N2. In a case where the first clock signal changes from a low level to a high level, due to a bootstrap effect of the first capacitor C1, the level of the first node N1 is further raised to the first level, so that the second transistor M2 is sufficiently turned on, so that the high level of the first clock signal is sufficiently written into the second node N2, so that the level of the second node N2 reaches a predetermined value, for example, the level of the second node N2 is equal to the high level of the first clock signal.

The isolation sub-circuit 130 may be implemented as a third transistor M3. A gate electrode of the third transistor M3 is connected to the second node N2, a first electrode of the third transistor M3 is connected to a first voltage terminal VDD to receive a first voltage (here, the first voltage terminal VDD is equivalent to the blanking pull-up signal terminal Bla_up, and the first voltage serves as the blanking pull-up signal), and a second electrode of the third transistor M3 is connected to the first control node (e.g., the pull-up node Q). In a case where the second node N2 is at a high level (for example, the high level reaches a predetermined value), the third transistor M3 is sufficiently or approximately sufficiently turned on, to write the first voltage into the pull-up node Q, so that the level of the pull-up node Q is at a high level.

The control sub-circuit 140 may be implemented as a fourth transistor M4. A gate electrode of the fourth transistor M4 is connected to the second control node (e.g., the pull-down node QB), a first electrode of the fourth transistor M4 is connected to the second node N2, and a second electrode of the fourth transistor M4 is connected to a second voltage terminal VGL2 to receive a second voltage. In a case where the pull-down node QB is at a high level, the fourth transistor M4 is turned on, and the second node N2 is pulled down to a low level, thereby ensuring that the third transistor M3 is turned off to prevent the pull-up node Q from being affected by the blanking pull-up signal (e.g., the first voltage at the first voltage terminal VDD) in the display period.

For example, the first voltage terminal VDD is configured to provide a DC high-level signal, which is referred to as the first voltage; and the second voltage terminal VGL2 is configured to provide a DC low-level signal, such as be grounded, which is referred to as the second voltage. The case may apply to the following embodiments, and it is not described again in the following embodiments.

The display input circuit 200 may be implemented as a fifth transistor M5. A gate electrode of the fifth transistor M5 is connected to the display input signal terminal STU2 to receive the display input signal, a first electrode of the fifth transistor M5 is connected to the first voltage terminal VDD to receive the first voltage (here, the first voltage terminal VDD is equivalent to the display pull-up signal terminal Dis_up, and the first voltage serves as the display pull-up signal), and a second electrode of the fifth transistor M5 is connected to the first control node (e.g., the pull-up node Q). In a case where the display input signal is at an effective level (e.g., a high level), the fifth transistor M5 is turned on, thereby writing the first voltage into the pull-up node Q, so that the pull-up node Q is at a high level.

For example, in some examples, the output terminal OP of the output circuit 300 includes at least one shift signal output terminal CR and at least one pixel scanning signal output terminal Out, so as to improve the driving capability of the shift register unit 10. For example, the shift signal output terminal CR is used to provide the blanking input signal to a next shift register unit 10, and the pixel scanning signal output terminal Out is used to provide a driving signal to the pixel circuit. An output signal of the shift signal output terminal CR is identical to an output signal of the pixel scanning signal output terminal Out.

The output circuit 300 may be implemented as a sixth transistor M6, a seventh transistor M7, and a second capacitor C2. A gate electrode of the sixth transistor M6 is connected to the first control node (e.g., the pull-up node Q), a first electrode of the sixth transistor M6 is connected to a second clock signal terminal CLKB to receive a second clock signal (here, the second clock signal terminal CLKB is equivalent to the composite output signal terminal Com and the second clock signal serves as the composite output signal), and a second electrode of the sixth transistor M6 is connected to the shift signal output terminal CR. A gate electrode of the seventh transistor M7 is connected to the first control node (e.g., the pull-up node Q), a first electrode of the seventh transistor M7 is connected to the second clock signal terminal CLKB to receive the second clock signal as the composite output signal, and a second electrode of the seventh transistor M7 is connected to the pixel scanning signal output terminal Out. A first electrode of the second capacitor C2 is connected to the first control node (e.g., the pull-up node Q), and a second electrode of the second capacitor C2 is connected to the second electrode of the sixth transistor M6. Of course, the embodiments of the present disclosure are not limited to this case. For example, in other examples, the second electrode of the second capacitor C2 may also be connected to the second electrode of the seventh transistor M7. In a case where the pull-up node Q is at an effective level (e.g., a high level), the sixth transistor M6 and the seventh transistor M7 are both turned on, thereby outputting the second clock signal to the shift signal output terminal CR and the pixel scanning signal output terminal Out, respectively.

The noise reduction circuit 400 may be implemented as an eighth transistor M8, a ninth transistor M9, and a tenth transistor M10. A gate electrode of the eighth transistor M8 is connected to the second control node (e.g., the pull-down node QB), a first electrode of the eighth transistor M8 is connected to the first control node (e.g., the pull-up node Q), and a second electrode of the eighth transistor M8 is connected to a third voltage terminal VGL1 to receive a third voltage. A gate electrode of the ninth transistor M9 is connected to the second control node (e.g., the pull-down node QB), a first electrode of the ninth transistor M9 is connected to the shift signal output terminal CR, and a second electrode of the ninth transistor M9 is connected to the third voltage terminal VGL1 to receive the third voltage. A gate electrode of the tenth transistor M10 is connected to the second control node (e.g., the pull-down node QB), a first electrode of the tenth transistor M10 is connected to the pixel scanning signal output terminal Out, and a second electrode of the tenth transistor M10 is connected to a fourth voltage terminal to receive a fourth voltage (here, the second voltage terminal VGL2 serves as the fourth voltage terminal, and the second voltage serves as the fourth voltage).

For example, the third voltage terminal VGL1 is configured to provide a DC low-level signal, such as be grounded, and the DC low-level signal is referred to as the third voltage. This case may also apply to the following embodiments, and it is not described again in the following embodiments. For example, in some examples, the third voltage of the third voltage terminal VGL1 is lower than the second voltage of the second voltage terminal VGL2; and in other examples, the third voltage of the third voltage terminal VGL1 is equal to the second voltage of the second voltage terminal VGL2. The third voltage and the second voltage may be identical or different, which may depend on actual requirements.

In a case where the pull-down node QB is at an effective level (e.g., a high level), the eighth transistor M8, the ninth transistor M9, and the tenth transistor M10 are all turned on, so that the pull-up node Q and the shift signal output terminal CR are electrically connected to the third voltage terminal VGL1, and the pixel scanning signal output terminal Out is electrically connected to the second voltage terminal VGL2, thereby performing noise reduction on the pull-up node Q, the shift signal output terminal CR, and the pixel scanning signal output terminal Out. It should be noted that in the embodiments of the present disclosure, in a case where the shift register unit includes a plurality of the shift signal output terminals CR and/or a plurality of the pixel scanning signal output terminals Out, the noise reduction circuit 400 correspondingly includes a plurality of transistors correspondingly connected to the plurality of the shift signal output terminals CR and/or the plurality of the pixel scanning signal output terminals Out, so as to perform the noise reduction on the plurality of the shift signal output terminals CR and/or the plurality of the pixel scanning signal output terminals Out.

The first control circuit 500 may be implemented as an eleventh transistor M11, a twelfth transistor M12, and a thirteenth transistor M13. A gate electrode of the eleventh transistor M11 is connected to a first electrode of the eleventh transistor M11, and is connected to a fifth voltage terminal VDD_A to receive a fifth voltage, and a second electrode of the eleventh transistor M11 is connected to the second control node (e.g., the pull-down node QB). A gate electrode of the twelfth transistor M12 is connected to a first electrode of the twelfth transistor M12, and is connected to a sixth voltage terminal VDD_B to receive a sixth voltage, and a second electrode of the twelfth transistor M12 is connected to the second control node (e.g., the pull-down node QB). A gate electrode of the thirteenth transistor M13 is connected to the first control node (e.g., the pull-up node Q), a first electrode of the thirteenth transistor M13 is connected to the second control node (e.g., the pull-down node QB), and a second electrode of the thirteenth transistor M13 is connected to the third voltage terminal VGL1 to receive the third voltage.

For example, in some examples, the fifth voltage terminal VDD_A and the sixth voltage terminal VDD_B are configured to alternately provide DC high-level signals, so as to alternately turn on the eleventh transistor M11 and the twelfth transistor M12 to avoid performance drift caused by long-term conduction of the transistors. For example, in a case where the fifth voltage terminal VDD_A provides a high-level signal, the sixth voltage terminal VDD_B provides a low-level signal, and at this time, the eleventh transistor M11 is turned on and the twelfth transistor M12 is turned off. In a case where the sixth voltage terminal VDD_B provides a high-level signal, the fifth voltage terminal VDD_A provides a low-level signal, and at this time, the twelfth transistor M12 is turned on and the eleventh transistor M11 is turned off. For example, a signal provided by the fifth voltage terminal VDD_A is referred to as the fifth voltage, and a signal provided by the sixth voltage terminal VDD_B is referred to as the sixth voltage. This case may also apply to the following embodiments, and it is not described again in the following embodiments.

In a case where the pull-up node Q is at an effective level (for example, a high level), the thirteenth transistor M13 is turned on, and the pull-down node QB can be pulled down to a low level by designing a channel aspect ratio of the thirteenth transistor M13 and a channel aspect ratio of the turned-on eleventh transistor M11 or the turned-on twelfth transistor M12. In a case where the pull-up node Q is at a low level, the thirteenth transistor M13 is turned off. At this time, the eleventh transistor M11 or the twelfth transistor M12, which is turned on, writes a high-level signal provided by the fifth voltage terminal VDD_A or the sixth voltage terminal VDD_B into the pull-down node QB to pull up the pull-down node QB to a high level.

The blanking reset circuit 600 may be implemented as a fourteenth transistor M14. A gate electrode of the fourteenth transistor M14 is connected to the blanking reset signal terminal TRST to receive the blanking reset signal, a first electrode of the fourteenth transistor M14 is connected to the first control node (e.g., the pull-up node Q), and a second electrode of the fourteenth transistor M14 is connected to the third voltage terminal VGL1 to receive the third voltage. For example, in the blanking period, in a case where the blanking reset signal is at an effective level (e.g., a high level), the fourteenth transistor M14 is turned on, so that the pull-up node Q is electrically connected to the third voltage terminal VGL1, thereby resetting the pull-up node Q.

The display reset circuit 700 may be implemented as a fifteenth transistor M15. A gate electrode of the fifteenth transistor M15 is connected to the display reset signal terminal STD to receive the display reset signal, a first electrode of the fifteenth transistor M15 is connected to the first control node (e.g., the pull-up node Q), and a second electrode of the fifteenth transistor M15 is connected to the third voltage terminal VGL1 to receive the third voltage. For example, in the display period, in a case where the display reset signal is at an effective level (e.g., a high level), the fifteenth transistor M15 is turned on, so that the pull-up node Q is electrically connected to the third voltage terminal VGL1, thereby resetting the pull-up node Q.

Figure 7:
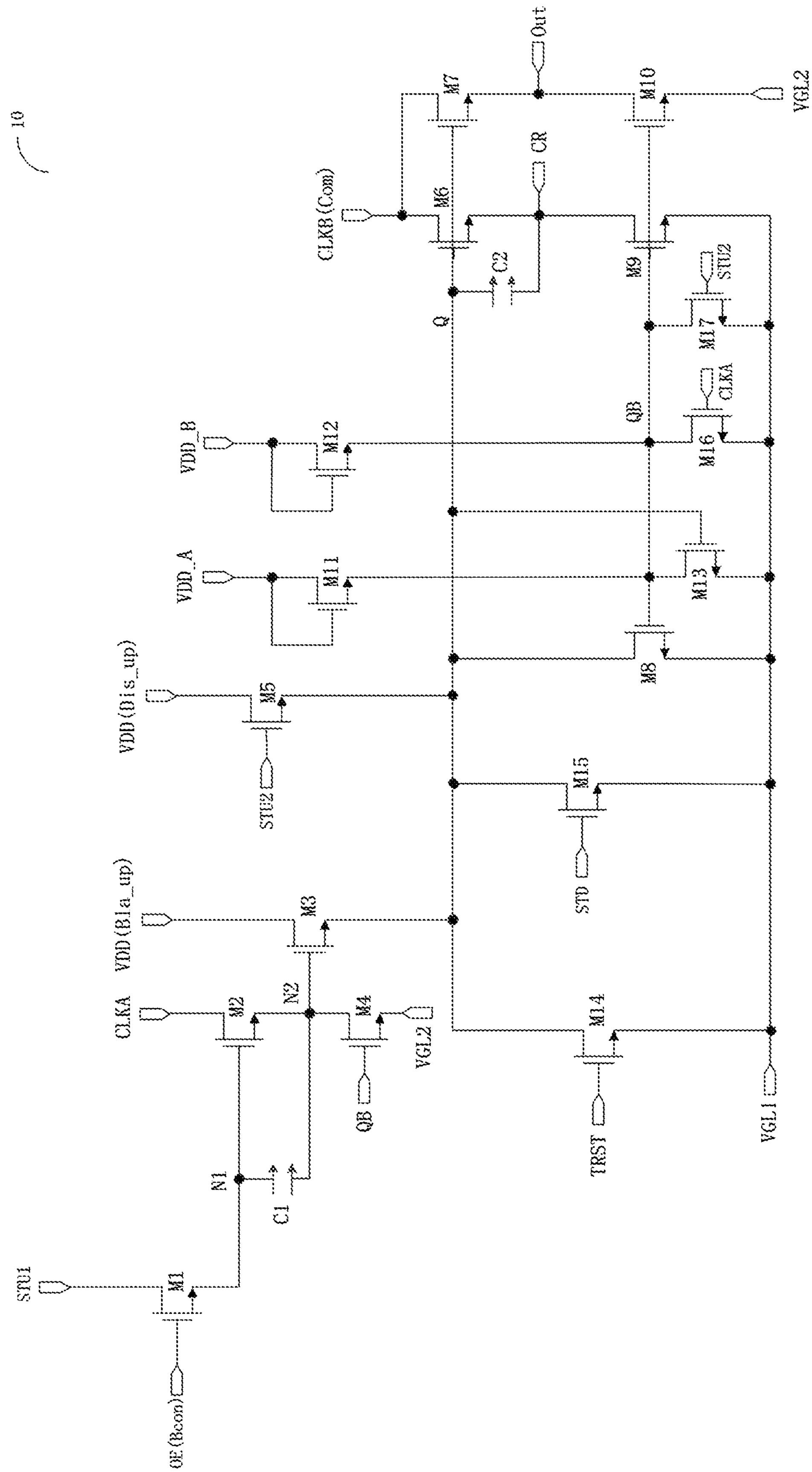
FIG. 7 is a circuit diagram of a specific implementation example of the shift register unit as illustrated in FIG. 5.

FIG. 7 is a circuit diagram of a specific implementation example of the shift register unit as illustrated in FIG. 5. Referring to FIG. 7, the shift register unit 10 includes first to seventeenth transistors M1-M17, and further includes a first capacitor C1 and a second capacitor C2. The connection relationship of the first to fifteenth transistors M1-M15, the first capacitor C1 and the second capacitor C2 is basically the same as the connection relationship of the shift register unit 10 as illustrated in FIG. 6, and is not described here again.

The second control circuit 800 may be implemented as a sixteenth transistor M16 and a seventeenth transistor M17. A gate electrode of the sixteenth transistor M16 is connected to the first clock signal terminal CLKA to receive the first clock signal, a first electrode of the sixteenth transistor M16 is connected to the second control node (e.g., the pull-down node QB), and a second electrode of the sixteenth transistor M16 is connected to the third voltage terminal VGL1 to receive the third voltage. A gate electrode of the seventeenth transistor M17 is connected to the display input signal terminal STU2 to receive the display input signal, a first electrode of the seventeenth transistor M17 is connected to the second control node (e.g., the pull-down node QB), and a second electrode of the seventeenth transistor M17 is connected to the third voltage terminal VGL1 to receive the third voltage. In the blanking period, in a case where the first clock signal is at an effective level (e.g., a high level), the sixteenth transistor M16 is turned on, so that the pull-down node QB is electrically connected to the third voltage terminal VGL1, thereby pulling down the pull-down node QB to a low level. In the display period, in a case where the display input signal is at an effective level (e.g., a high level), the seventeenth transistor M17 is turned on, so that the pull-down node QB is electrically connected to the third voltage terminal VGL1, thereby pulling down the pull-down node QB to a low level.

It should be noted that, in the embodiments of the present disclosure, the specific implementations of the blanking input circuit 100, the display input circuit 200, the output circuit 300, the noise reduction circuit 400, the first control circuit 500, the blanking reset circuit 600, the display reset circuit 700, and the second control circuit 800 are not limited to the above-described implementations, but can be any suitable implementations, such as a conventional connection method known by those skilled in the art, as long as the corresponding functions are ensured to be realized.

Figure 8:
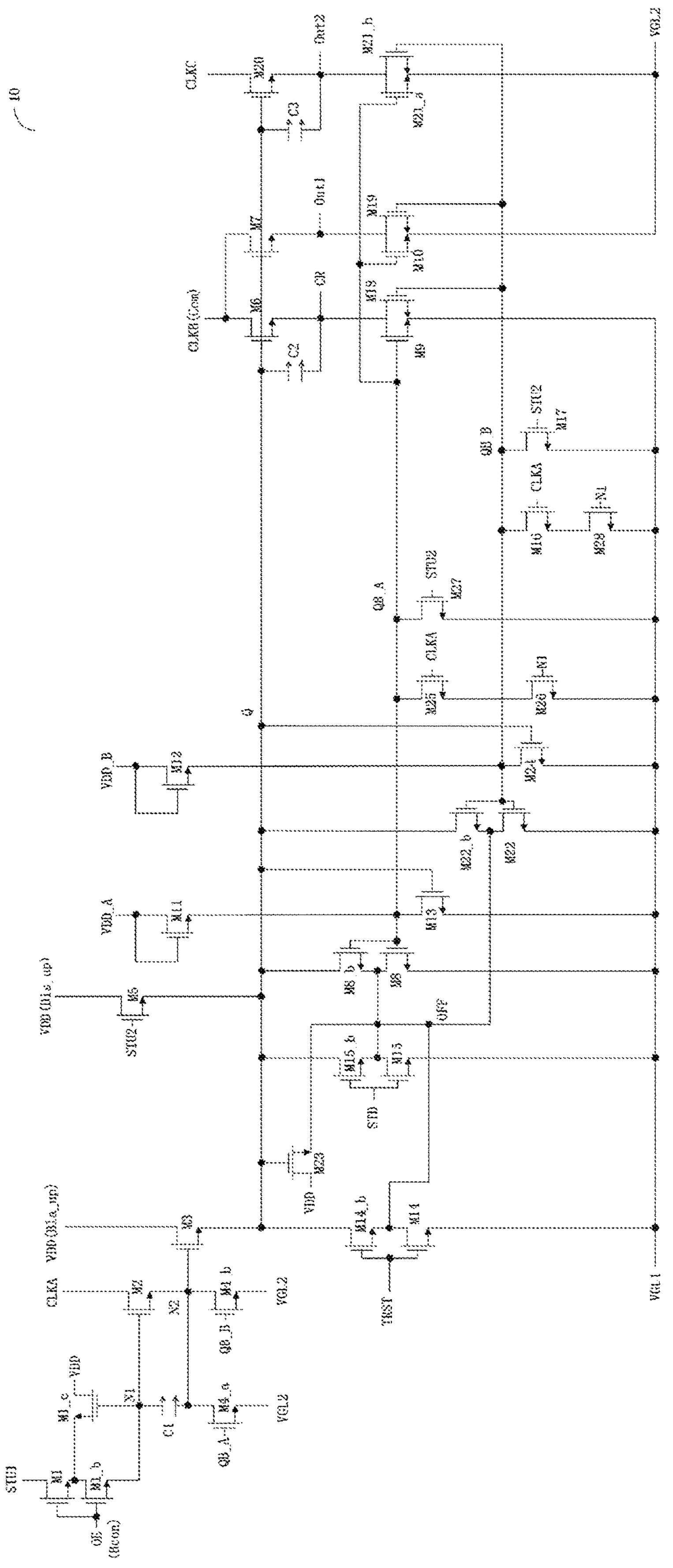
FIG. 8 is a circuit diagram of another specific implementation example of the shift register unit as illustrated in FIG. 5.

FIG. 8 is a circuit diagram of another specific implementation example of the shift register unit as illustrated in FIG. 5. Referring to FIG. 8, the shift register unit 10 of this embodiment includes a plurality of leakage prevention circuits, two second control nodes (e.g., a first pull-down node QB_A and a second pull-down node QB_B), two pixel scanning signal output terminals (a first pixel scanning signal output terminal Out1 and a second pixel scanning signal output terminal Out2), and other structures are basically the same as the shift register unit 10 as illustrated in FIG. 7.

In the shift register unit 10 as illustrated in FIG. 7, the first capacitor C1 can be used to maintain the high level of the first node N1, and the second capacitor C2 can be used to maintain the high level of the pull-up node Q. At this time, there are some transistors whose first electrodes are connected to the pull-up node Q and/or the first node N1, and second electrodes of the transistors are connected to the low-level signal lines. Even in a case where a non-conductive signal is input to gate electrodes of these transistors, leakage may occur due to a voltage difference between the first electrodes and the second electrodes of these transistors, thereby deteriorating the effect of the circuit in maintaining the high level of the pull-up node Q and/or the first node N1. Therefore, the shift register unit 10 as illustrated in FIG. 8 adds a plurality of leakage prevention circuits to improve the effect of maintaining the high level of the pull-up node Q and/or the first node N1.

For example, referring to FIG. 8, a first leakage prevention circuit may be implemented as a first leakage prevention transistor M1_*b* and a second leakage prevention transistor M1_*c*, and is configured to, in a case where the first node N1 is at a high level, prevent charges at the first node N1 from leaking to the blanking input signal terminal STU1 via the first transistor M1. A gate electrode of the first leakage prevention transistor M1_*b* is connected to the gate electrode of the first transistor M1 (the random signal terminal OE), a first electrode of the first leakage prevention transistor M1_*b* is connected to the second electrode of the first transistor M1, and a second electrode of the first leakage prevention transistor M1_*b* is connected to the first node N1. A gate electrode of the second leakage prevention transistor M1_*c* is connected to the first node N1, a first electrode of the second leakage prevention transistor M1_*c* is connected to the first voltage terminal VDD, and a second electrode of the second leakage prevention transistor M1_*c* is connected to the first electrode of the first leakage prevention transistor M1_*b*.

In a case where the first node N1 is at a high level, the second leakage prevention transistor M1_*c* is turned on under control of the first node N1, and the first voltage (high voltage) is written to the first electrode of the first leakage prevention transistor M1_*b*, so that both the first electrode and the second electrode of the first leakage prevention transistor M1_*b* are in a high level state to prevent the charges at the first node N1 from leaking through the first leakage prevention transistor M1_*b*. At this time, because the gate electrode of the first transistor M1 is connected to the gate electrode of the first leakage prevention transistor M1_*b*, the combination of the first leakage prevention transistor M1_*b* and the first transistor M1 can realize the same function as the aforementioned first transistor M1 and has the leakage prevention effect as well.

Similarly, for the eighth transistor M8, the fourteenth transistor M14, the fifteenth transistor M15, and a twenty-second transistor M22, which are connected to the pull-up node Q, the same leakage prevention circuit as the aforementioned principle can also be adopted to realize the leakage prevention effect. For example, a second leakage prevention circuit may be implemented as a third leakage prevention transistor M8_*b*, a fourth leakage prevention transistor M14_*b*, a fifth leakage prevention transistor M15_*b*, a sixth leakage prevention transistor 22_*b*, and a seventh leakage prevention transistor M23. The connection mode of the second leakage prevention circuit is similar to the above-mentioned first leakage prevention circuit, and is not repeated here again.

In a case where the pull-up node Q is at a high level, the seventh leakage prevention transistor M23 is turned on, and a leakage prevention node OFF is at a high level, so that a first electrode and a second electrode of the third leakage prevention transistor M8_*b*, a first electrode and a second electrode of the fourth leakage prevention transistor M14_*b*, a first electrode and a second electrode of the fifth leakage prevention transistor M15_*b*, and a first electrode and a second electrode of the sixth leakage prevention transistor M22_*b* are all at a high level to prevent charges at the pull-up node Q from leaking. At this time, the combination of the eighth transistor M8, the fourteenth transistor M14, the fifteenth transistor M15, and the twenty-second transistor M22 with the second leakage prevention circuit can realize the same functions as the aforementioned eighth transistor M8, the fourteenth transistor M14, and the fifteenth transistor M15, and has the leakage prevention effect as well.

It should be noted that those skilled in the art can understand that according to the embodiments of the circuit with leakage prevention function provided by the embodiments of the present disclosure, one or more transistors in the shift register unit 10 can be selected according to the actual situation to add an leakage prevention circuit structure. FIG. 8 only illustrates an exemplary circuit structure including a leakage prevention circuit and does not constitute a limitation to the embodiments of the present disclosure.

As illustrated in FIG. 8, the shift register unit 10 includes two second control nodes, for example, the first pull-down node QB_A and the second pull-down node QB_B. Accordingly, the eleventh transistor M11 and the thirteenth transistor M13 jointly control a level of the first pull-down node QB_A, and the twelfth transistor M12 and the twenty-fourth transistor M24 jointly control a level of the second pull-down node QB_B. Because the fifth voltage terminal VDD_A and the sixth voltage terminal VDD_B alternately provide high-level signals, in a case where the pull-up node Q is at a low level, the first pull-down node QB_A and the second pull-down node QB_B alternately are at a high level; and in a case where the pull-up node Q is at a high level, both the first pull-down node QB_A and the second pull-down node QB_B are at a low level. In this way, the threshold voltage drift of the transistor can be prevented. For the circuit connection mode and related working principle of the above two second control nodes can be referred to the conventional shift register unit with two pull-down nodes, which are not repeated here again.

Correspondingly, the second control circuit 800 is also implemented as two groups of transistors, a twenty-fifth transistor M25, a twenty-sixth transistor M26, and a twenty-seventh transistor M27 are one group, and a sixteen transistor M16, a seventeen transistor M17, and a twenty-eighth transistor M28 are another group. The two groups of transistors are respectively connected to the first pull-down node QB_A and the second pull-down node QB_B, so as to respectively pull down the first pull-down node QB_A and the second pull-down node QB_B. For example, the sixteenth transistor M16 and the twenty-eighth transistor M28 are connected in series between the second pull-down node QB_B and the third voltage terminal VGL1, a gate electrode of the sixteenth transistor M16 is connected to the first clock signal terminal CLKA, and a gate electrode of the twenty-eighth transistor M28 is connected to the first node N1.

In a case where both the first clock signal and the first node N1 are at an effective level (e.g., a high level), both the sixteenth transistor M16 and the twenty-eighth transistor M28 are turned on, thereby pulling down the second pull-down node QB_B to a low level. The pull-down control mode of the second control circuit 800 for the first pull-down node QB_A is similar to the pull-down control mode of the second pull-down node QB_B, and is not described here again. For example, in a case where a plurality of shift register units 10 are cascaded, the above-described manner can enable the first pull-down node QB_A and the second pull-down node QB_B of the shift register unit 10, that performs output, to be pulled down, while first pull-down nodes QB_A and second pull-down nodes QB_B of other shift register units 10 are not pulled down, so as to prevent shift signal output terminals CR, first pixel scanning signal output terminals Out1, and second pixel scanning signal output terminals Out2 of the other shift register units 10 from being in a floating state, thereby reducing noise of the output signal.

The shift register unit 10 includes two pixel scanning signal output terminals, namely, the first pixel scanning signal output terminal Out1 and the second pixel scanning signal output terminal Out2. The connection mode of the first pixel scanning signal output terminal Out1 is similar to the connection mode of the pixel scanning signal output terminal Out described above. The second pixel scanning signal output terminal Out2 is connected to a second electrode of a twentieth transistor M20, a gate electrode of the twentieth transistor M20 is connected to the pull-up node Q, and a first electrode of the twentieth transistor M20 is connected to a third clock signal terminal CLKC. A third capacitor C3 is connected between the gate electrode of the twentieth transistor M20 and the second electrode of the twentieth transistor M20.

In a case where the pull-up node Q is at a high level, the seventh transistor M7 and the twentieth transistor M20 are turned on, the second clock signal of the second clock signal terminal CLKB is output to the first pixel scanning signal output terminal Out1, and a third clock signal of the third clock signal terminal CLKC is output to the second pixel scanning signal output terminal Out2. For example, in some examples, the clock signal provided by the second clock signal terminal CLKB is identical to the clock signal provided by the third clock signal terminal CLKC, so a signal output by the first pixel scanning signal output terminal Out1 is identical to a signal output by the second pixel scanning signal output terminal Out2, so as to further improve the driving capability. For example, in some other examples, the signal provided by the second clock signal terminal CLKB is different from the signal provided by the third clock signal terminal CLKC, so that the signal output by the first pixel scanning signal output terminal Out1 is different from the signal output by the second pixel scanning signal output terminal Out2, so as to provide various driving signals for the pixel unit.

Accordingly, in order to perform pull-down noise reduction on the second pixel scanning signal output terminal Out2, two transistors M21_*a* and M21_*b* need to be provided, and a gate electrode of the transistor M21_*a* and a gate electrode of the transistor M21_*b* are respectively connected to the first pull-down node QB_A and the second pull-down node QB_B. Similarly, the gate electrode of the transistor M9 and the gate electrode of the transistor M18 are respectively connected to the first pull-down node QB_A and the second pull-down node QB_B, to perform pull-down noise reduction on the shift signal output terminal CR. The gate electrode of the transistor M10 and the gate electrode of the transistor M19 are respectively connected to the first pull-down node QB_A and the second pull-down node QB_B, to perform pull-down noise reduction on the first pixel scanning signal output terminal Out1. Accordingly, the gate electrode of the transistor M4_*a* and the gate electrode of the transistor M4_*b* are respectively connected to the first pull-down node QB_A and the second pull-down node QB_B, to perform pull-down control on the second node N2.

Figure 9A:
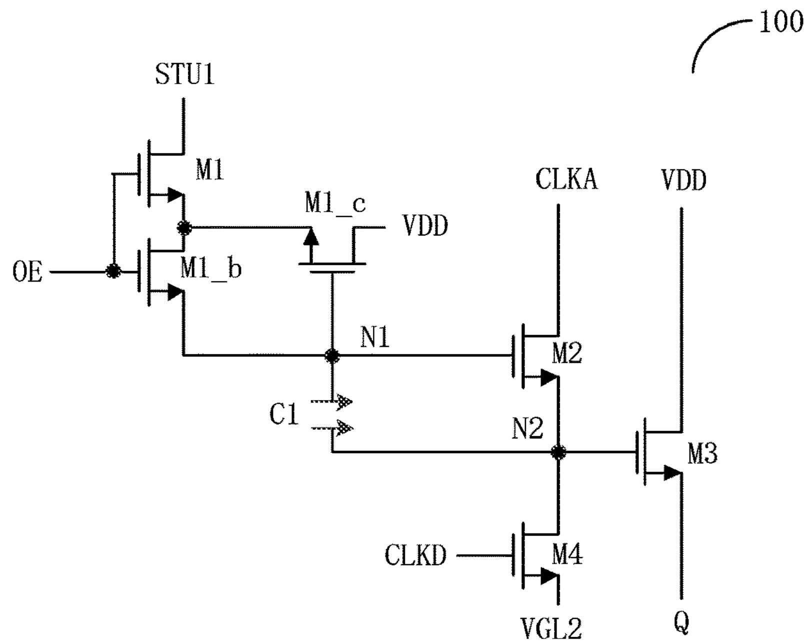
FIGS. 9A-9C are circuit diagrams of specific implementation examples of a blanking input circuit of a shift register unit provided by some embodiments of the present disclosure.
Figure 9B:
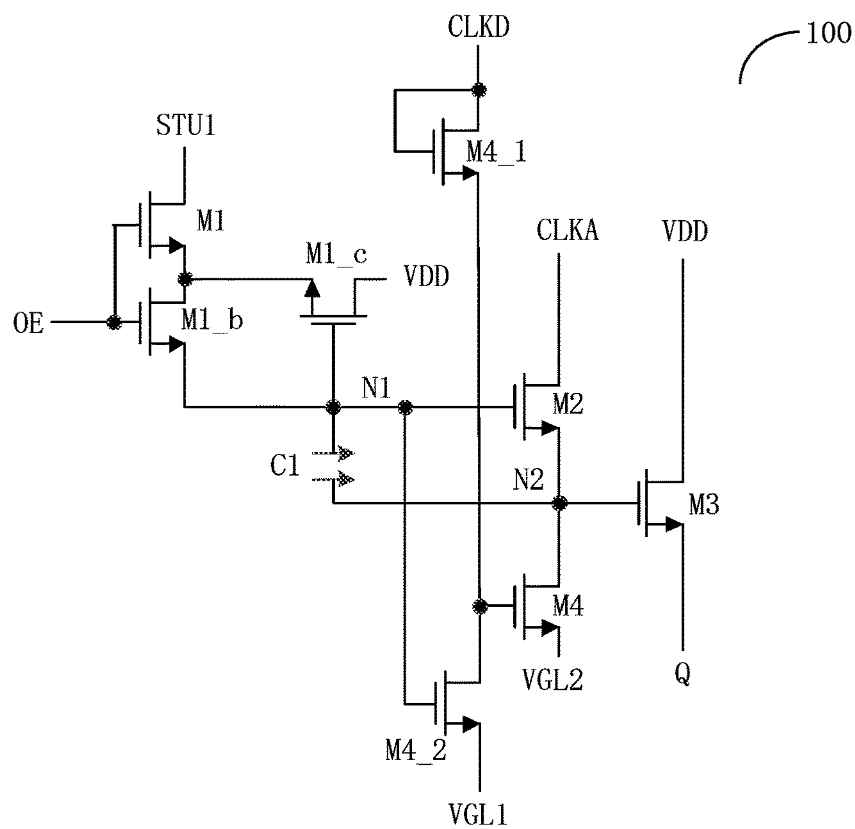
Figure 9C:
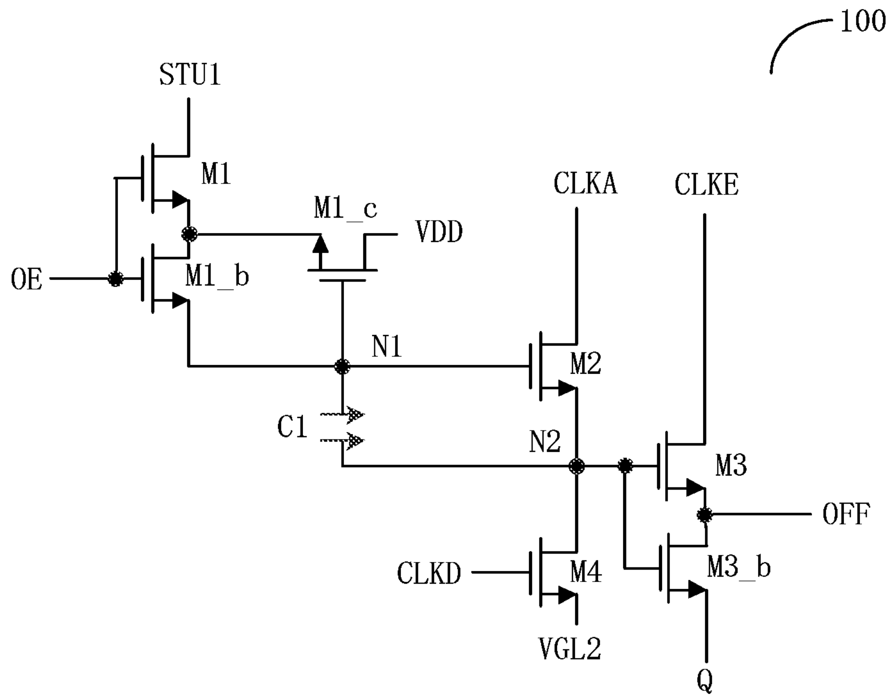

FIGS. 9A-9C are circuit diagrams of specific implementation examples of a blanking input circuit of a shift register unit provided by some embodiments of the present disclosure. Referring to FIG. 9A, the blanking input circuit 100 includes a leakage prevention circuit to prevent leakage of electricity from the first node N1, and the operation principle of the leakage prevention circuit is similar to the operation principle of the aforementioned leakage prevention circuit and is not described here again. Unlike the embodiment as illustrated in FIG. 7, in this example, the gate electrode of the fourth transistor M4 is connected to a fourth clock signal terminal CLKD to receive a fourth clock signal and pull down the second node N2 under control of the fourth clock signal. It should be noted that the embodiments of the present disclosure are not limited to this case. The gate electrode of the fourth transistor M4 may be connected to the pull-down node QB, the fourth clock signal terminal CLKD or other suitable signal terminals as long as the fourth transistor M4 can be controlled to be turned on to pull down the second node N2. Referring to FIG. 9B, compared with the blanking input circuit 100 as illustrated in FIG. 9A, the control mode of the gate electrode of the fourth transistor M4 in this example is different. With the circuit structure formed by a transistor M4_1 and a transistor M4_2, in a case where the fourth clock signal terminal CLKD provides a high level, the gate electrode of the fourth transistor M4 is at a high level, and the fourth transistor M4 is turned on, thereby pulling down the second node N2. Referring to FIG. 9C, compared with the blanking input circuit 100 as illustrated in FIG. 9A, the blanking input circuit 100 in this example further includes a leakage prevention circuit for the third transistor M3 to prevent the pull-up node Q from leakage of electricity, and the operation principle of the leakage prevention circuit is similar to the operation principle of the aforementioned leakage prevention circuit and is not repeated here again. Also, in this example, the first electrode of the third transistor M3 is connected to a fifth clock signal terminal CLKE to receive a fifth clock signal as the blanking pull-up signal.

Figure 10:
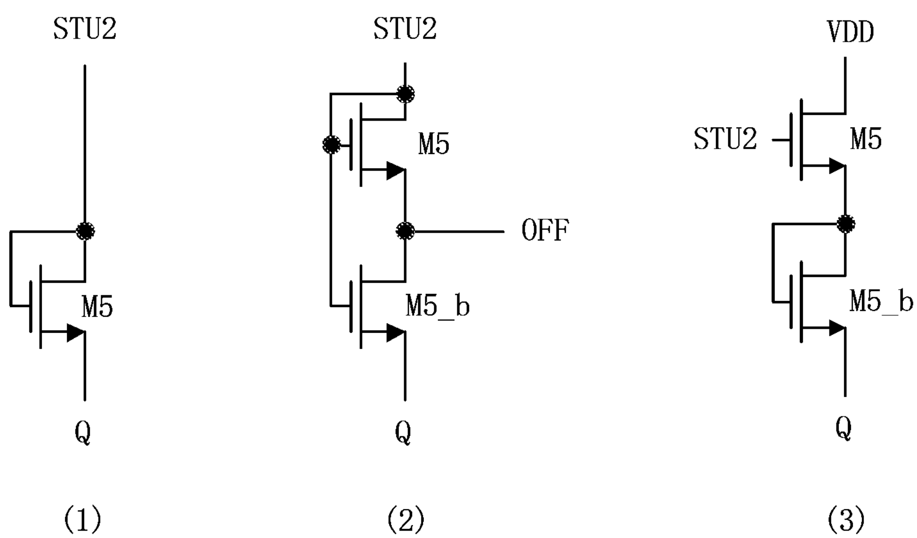
FIG. 10 is a circuit diagram of a specific implementation example of a display input circuit of a shift register unit provided by some embodiments of the present disclosure.

FIG. 10 is a circuit diagram of a specific implementation example of a display input circuit of a shift register unit provided by some embodiments of the present disclosure. Referring to FIG. 10(1), in some examples, the gate electrode of the fifth transistor M5 is connected to the first electrode of the fifth transistor M5, and is connected to the display input signal terminal STU2. Referring to FIG. 10(2), compared with the connection mode as illustrated in FIG. 10(1), this example adds a leakage prevention circuit to prevent the pull-up node Q from leakage of electricity. Referring to FIG. 10(3), compared with the display input circuit 200 in the shift register unit 10 as illustrated in FIG. 6, a transistor M5_*b*, which is in a diode-connection mode, is connected in series between the fifth transistor M5 and the pull-up node Q, which can also play a role in preventing leakage of electricity.

Figure 11:
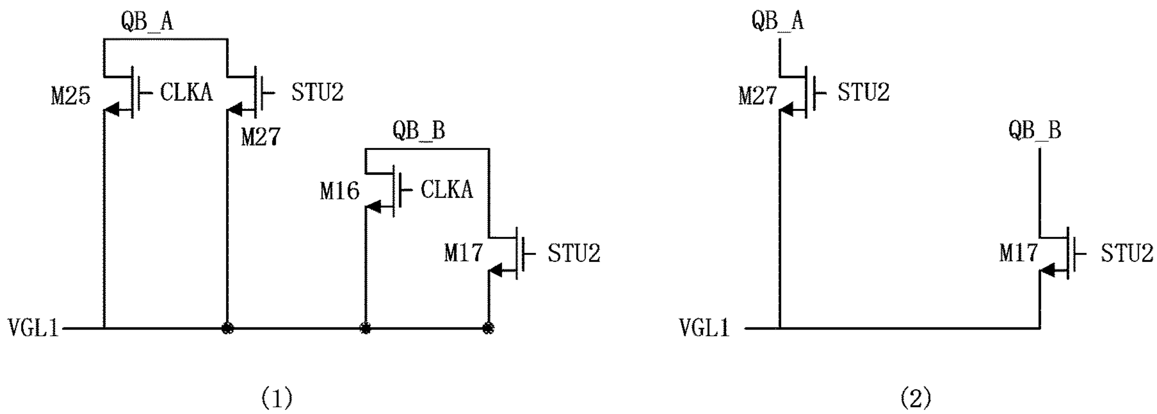
FIG. 11 is a circuit diagram of a specific implementation example of a second control circuit of a shift register unit provided by some embodiments of the present disclosure.

FIG. 11 is a circuit diagram of a specific implementation example of a second control circuit of a shift register unit provided by some embodiments of the present disclosure. Referring to FIG. 11(1), compared with the second control circuit 800 in the shift register unit 10 as illustrated in FIG. 8, in this example, the twenty-sixth transistor M26 and the twenty-eighth transistor M28 as illustrated in FIG. 8 are omitted. The second control circuit 800 of this example can realize corresponding functions and simplify the circuit structure. Referring to FIG. 11(2), compared with the circuit as illustrated in FIG. 11(1), in this example, the transistor M25 and the transistor M16 are omitted, so the second control circuit 800 in this example pulls down the first pull-down node QB_A and the second pull-down node QB_B only in the display period in response to the display input signal provided from the display input signal terminal STU2, and does not pull down in the blanking period, thus not affecting the display effect while simplifying the circuit structure.

It should be noted that in the embodiments of the present disclosure, the first capacitor C1, the second capacitor C2, and the third capacitor C3 may be capacitor devices manufactured by a process procedure, for example, a special capacitor electrode is manufactured to realize the capacitor devices, respective electrodes of the capacitors may be realized by a metal layer, a semiconductor layer (e.g., doped polysilicon), etc., and the first capacitor C1, the second capacitor C2, and the third capacitor C3 may also be parasitic capacitances between respective devices, and may be realized by the transistor itself and other devices and wires. The connection mode of the first capacitor C1, the second capacitor C2 and the third capacitor C3 is not limited to the above-described mode, but may be other suitable connection modes as long as corresponding levels can be stored.

It should be noted that in the description of various embodiments of the present disclosure, the first control node, the second control node, the first node N1, the second node N2, the pull-up node Q, the pull-down node QB, the first pull-down node QB_A, the second pull-down node QB_B, and the leakage prevention node OFF represent junction points of the relevant electrical connections in the circuit diagram, and may also be one wire or a plurality of wires connected the relevant circuits in the circuit diagram. The embodiments of the present disclosure are not limited to this case.

It should be noted that the transistors used in the embodiments of the present disclosure can all be thin film transistors, field effect transistors, or other switching devices with the same characteristics. The embodiments of the present disclosure are described by taking a case that the transistor is the thin film transistor as an example. A source electrode and a drain electrode of the transistor used here may be symmetrical in structure, so the source electrode and the drain electrode of the transistor can be structurally indistinguishable. In the embodiments of the present disclosure, in order to distinguish the two electrodes of the transistor except a gate electrode of the transistor, one of the two electrodes is directly described to be a first electrode, and the other electrode is directly described to be a second electrode.

In addition, the embodiments of the present disclosure are described by taking a case that the transistors are N-type transistors as an example, and in this case, a first electrode of a transistor is a drain electrode and a second electrode of the transistor is a source electrode. It should be noted that the present disclosure includes but is not limited to this case. For example, one or more transistors in the shift register unit 10 provided by the embodiments of the present disclosure may also adopt P-type transistors. In this case, the first electrode of the transistor is the source electrode and the second electrode is the drain electrode, as long as respective electrodes of a selected type of transistor are correspondingly connected to respective electrodes of the corresponding transistor in the embodiments of the present disclosure, and the corresponding voltage terminal is provided with a corresponding high voltage or a corresponding low voltage. In a case where an N-type transistor is used, indium gallium zinc oxide (IGZO) can be used as an active layer of the thin film transistor. Compared with transistors using low temperature poly silicon (LTPS) or amorphous silicon (such as hydrogenated amorphous silicon) as the active layer of the thin film transistor, a size of the transistor can be effectively reduced and leakage current can be prevented.

In the description of the embodiments of the present disclosure, for example, in a case where respective circuits are implemented as N-type transistors, the term "pull-up" represents charging a node or an electrode of a transistor so as to raise an absolute value of a level of the node or the electrode, thereby implementing an operation (e.g., turn-on) of the corresponding transistor; and the term "pull-down" represents discharging a node or an electrode of a transistor so as to decrease an absolute value of a level of the node or the electrode, thereby implementing an operation (e.g., turn-off) of the corresponding transistor. For another example, in a case where respective circuits are implemented as P-type transistors, the term "pull-up" represents discharging a node or an electrode of a transistor so as to decrease an absolute value of a level of the node or the electrode, thereby implementing the operation (e.g., turn-on) of the corresponding transistor; and the term "pull-down" represents charging a node or an electrode of a transistor so as to raise an absolute value of a level of the node or the electrode, thereby implementing the operation (e.g., turn-off) of the corresponding transistor.

Figure 12:
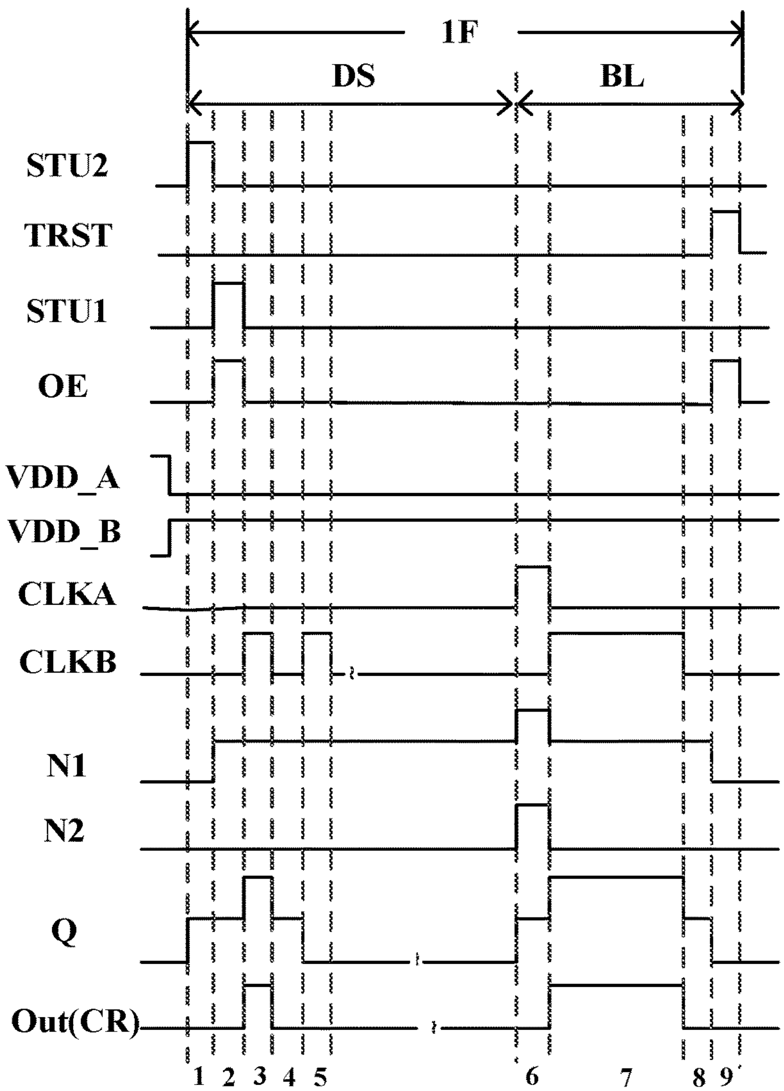
FIG. 12 is a signal timing diagram of a shift register unit provided by some embodiments of the present disclosure.

FIG. 12 is a signal timing diagram of a shift register unit provided by some embodiments of the present disclosure. The operation principle of the shift register unit 10 as illustrated in FIG. 6 is described below with reference to the signal timing diagram as illustrated in FIG. 12, and the operation principle of the shift register unit 10 as illustrated in FIG. 6 is described by taking a case that respective transistors are N-type transistors as an example, but the embodiments of the present disclosure are not limited thereto.

As illustrated in FIG. 12 and in the following description, 1F represents a timing of the operation of the shift register unit 10 during displaying one frame by the gate driving circuit, DS represents the display period of one frame, and BL represents the blanking period of one frame. STU1, STU2, TRST, OE, VDD_A, VDD_B, CLKA, CLKB, Out, CR, etc. represent both corresponding signal terminals and corresponding signals. This case may also apply to the following embodiments and is not described again.

In an initial phase 0 (not illustrated in the figure), both the random signal OE and the blanking reset signal TRST are high levels. The first transistor M1 is turned on, and in this case, the blanking input signal STU1 is at a low level, thereby resetting the first node N1. The fourteenth transistor M14 is turned on, thereby resetting the pull-up node Q. For example, in a case where a plurality of shift register units 10 are cascaded, the first nodes N1 and the pull-up nodes Q of the plurality of shift register units 10 may be globally reset at this phase.

In the display period DS, in a first phase 1, the display input signal STU2 and the sixth voltage VDD_B are at a high level. The fifth transistor M5 is turned on and pulls up the pull-up node Q to a high level. The sixth transistor M6 and the seventh transistor M7 are turned on under control of the pull-up node Q, and output the second clock signal CLKB to the shift signal output terminal CR and the pixel scanning signal output terminal Out. Because the second clock signal CLKB is at a low level at this time, both the shift signal output terminal CR and the pixel scanning signal output terminal Out output a low level. The thirteenth transistor M13 is turned on and the twelfth transistor M12 is turned on, and the pull-down node QB is a low level due to a voltage dividing effect of the thirteenth transistor M13 and the twelfth transistor M12.

In a second phase 2, the random signal OE and the blanking input signal STU1 are at a high level, the first transistor M1 is turned on, and the first node N1 is pulled up to a high level, which is stored by the first capacitor C1. The second transistor M2 is turned on under control of the first node N1 and writes the first clock signal CLKA to the second node N2. Because the first clock signal CLKA is at a low level at this time, the second node N2 is also at a low level, thereby turning off the third transistor M3. In this phase, the first capacitor C1 stores the high level signal of the first node N1 and holds the high level until the end of the display period of one frame for the usage in the blanking period. The pull-up node Q is kept at a high level, the sixth transistor M6 and the seventh transistor M7 are kept being turned on, and the low level signal is kept being output.

In a third phase 3, the second clock signal CLKB changes from a low level to a high level. Due to a bootstrap effect of the second capacitor C2, a potential of the pull-up node Q is further pulled up, the sixth transistor M6 and the seventh transistor M7 are sufficiently turned on, and the high level of the second clock signal CLKB is output to the shift signal output terminal CR and the pixel scanning signal output terminal Out.

In a fourth phase 4, the second clock signal CLKB changes to a low level. Due to the bootstrap effect of the second capacitor C2, the potential of the pull-up node Q is pulled down but remains at a high level. The sixth transistor M6 and the seventh transistor M7 are kept being turned on. The low level of the second clock signal CLKB is output to the shift signal output terminal CR and the pixel scanning signal output terminal Out to complete the reset of the output signal.

In a fifth phase 5, the display reset signal STD (not illustrated in the figure) is at a high level, and the fifteenth transistor M15 is turned on, thereby resetting the pull-up node Q, so that the pull-up node Q changes to a low level. The sixth transistor M6 and the seventh transistor M7 are turned off. The thirteenth transistor M13 is turned off, and the pull-down node QB is pulled up to a high level by the twelfth transistor M12 which is turned on. The eighth transistor M8 is turned on, under control of the high level of the pull-down node QB, to further perform noise reduction on the pull-up node Q. The ninth transistor M9 and the tenth transistor M10 are also turned on under control of the high level of the pull-down node QB, thereby performing noise reduction on the shift signal output terminal CR and the pixel scanning signal output terminal Out. The fourth transistor M4 is turned on under control of the high level of the pull-down node QB, thereby pulling down the second node N2 to ensure that the third transistor M3 is turned off. In subsequent phases of the display period DS, the pull-down node QB is kept at a high level, and the fourth transistor M4 is kept being turned on, thereby enabling the third transistor M3 to be turned off, so as to avoid writing noise to the pull-up node Q through the third transistor M3.

In the above-mentioned phases, the third transistor M3 is in a turn-off state because the second node N2 keeps at a low level all the time, thereby isolating the first voltage terminal VDD and the pull-up node Q, so as to prevent the first voltage of the first voltage terminal VDD from affecting the level of the pull-up node Q and further affecting the output signal in the display period. The level of the pull-up node Q is a tower-shaped waveform. The pull-up and reset of the output signal of the shift signal output terminal CR are all realized by the sixth transistor M6. The pull-up and reset of the output signal of the pixel scanning signal output terminal Out are all realized by the seventh transistor M7. The ninth transistor M9 and the tenth transistor M10 play an auxiliary pull-down role on the output signals of the shift signal output terminal CR and the pixel scanning signal output terminal Out, so that a size of the ninth transistor M9 and a size of the tenth transistor M10 can be reduced, which is beneficial to reducing the area of the circuit layout.

In the blanking period BL, in a sixth phase 6, the first node N1 remains at the high level written in the display period and the second transistor M2 is kept being turned on. The first clock signal CLKA changes to a high level. Due to a bootstrap effect of the first capacitor C1, the level of the first node N1 is further pulled up to a first level, for example, the first level is higher than the first voltage VDD. Therefore, the threshold voltage loss due to the first transistor M1 in a case where the first node N1 is charged in the display period is compensated. The high level of the first node N1 enables the second transistor M2 to be sufficiently turned on, and the high level of the first clock signal CLKA is sufficiently written into the second node N2, for example, so that the level of the second node N2 is equal to the high level of the first clock signal CLKA. The third transistor M3 is turned on under control of the high level of the second node N2 and pulls up the pull-up node Q to a high level. The sixth transistor M6 and the seventh transistor M7 are turned on to output the second clock signal CLKB to the shift signal output terminal CR and the pixel scanning signal output terminal Out. At this time, the second clock signal CLKB is at a low level, so both the shift signal output terminal CR and the pixel scanning signal output terminal Out output a low level. The thirteenth transistor M13 is turned on and the twelfth transistor M12 is turned on, and the pull-down node QB is at a low level due to the voltage dividing effect of the thirteenth transistor M13 and the twelfth transistor M12.

In a seventh phase 7, the first clock signal CLKA changes to a low level, and the third transistor M3 is turned off, so that the pull-up node Q does not leak electricity through the third transistor M3. The sixth transistor M6 and the seventh transistor M7 are kept being turned on. The second clock signal CLKB changes to a high level. Due to the bootstrap effect of the second capacitor C2, the potential of the pull-up node Q is further pulled up, the sixth transistor M6 and the seventh transistor M7 are sufficiently turned on, and the high level of the second clock signal CLKB is output to the shift signal output terminal CR and the pixel scanning signal output terminal Out.

In an eighth phase 8, the second clock signal CLKB changes to a low level, and due to the bootstrap effect of the second capacitor C2, the potential of the pull-up node Q is pulled down but still remains at a high level. The sixth transistor M6 and the seventh transistor M7 are kept being turned on. The low level of the second clock signal CLKB is output to the shift signal output terminal CR and the pixel scanning signal output terminal Out to complete the reset of the output signal.

In a ninth phase 9 (a last phase of the blanking period BL), the blanking reset signal TRST and the random signal OE are at a high level, and the fourteenth transistor M14 and the first transistor M1 are turned on, thereby resetting the pull-up node Q and the first node N1. In this way, the first node N1 remains at a high level for a short period of time to reduce the risk of the threshold voltage drift (e.g., positive drift) of the transistors connected to the first node N1, which is helpful to improve the reliability of the circuit.

In this embodiment, the blanking input circuit 100 can compensate the level of the first node N1 to compensate the threshold voltage loss generated during the charging process of the first node N1, and perform coupling control on the level of the second node N2 so that the level of the second node N2 reaches a predetermined value (e.g., equal to or slightly lower than the high level of the first clock signal CLKA). Therefore, under control of the level of the second node N2, the level of the pull-up node Q also reaches a predetermined value (for example, equal to or slightly lower than the first voltage VDD), so as to prevent the threshold voltage loss from affecting the level of the pull-up node Q, and further improve the accuracy of the blanking output signal. According to software simulation, the threshold voltage of each transistor is set to +10V and the high level of the first clock signal CLKA is set to +24V, and the level of the second node N2 of the shift register unit 10 as illustrated in FIG. 6 can reach +24V, that is, equal to the high level of the first clock signal CLKA. The level of the first node N1 can be pulled up to more than +35V under the bootstrap effect of the first capacitor C1.

Figure 13:
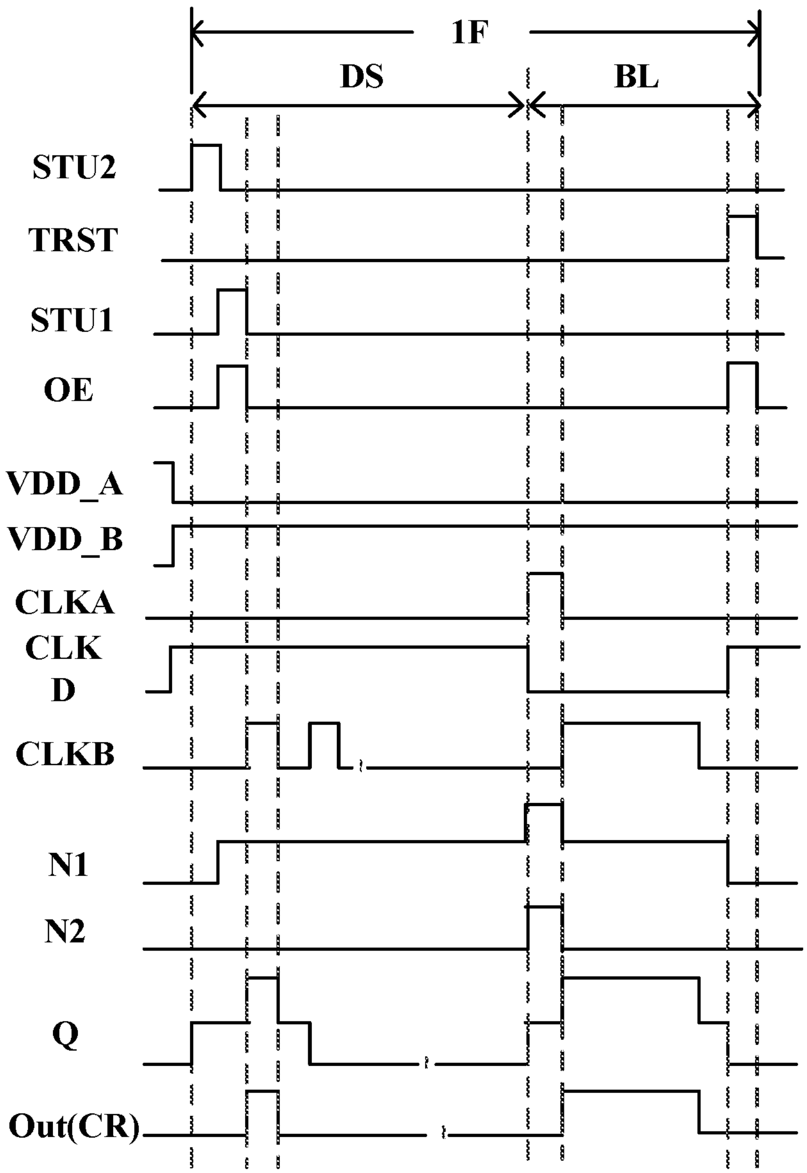
FIG. 13 is a signal timing diagram of another shift register unit provided by some embodiments of the present disclosure.

FIG. 13 is a signal timing diagram of another shift register unit provided by some embodiments of the present disclosure. For example, in this embodiment, the blanking input circuit 100 of the shift register unit 10 is implemented as the circuit structure as illustrated in FIG. 9A, and other structures of the shift register unit 10 are substantially the same as the shift register unit 10 as illustrated in FIG. 6. The gate electrode of the fourth transistor M4 is connected to a fourth clock signal terminal CLKD to receive a fourth clock signal. For example, in FIG. 13 and in the following description, CLKD represents both the fourth clock signal terminal and the fourth clock signal. As illustrated in FIG. 13, in the display period DS, the fourth clock signal CLKD is always kept at a high level, and the fourth transistor M4 is kept being turned on, so that the second node N2 is continuously pulled down to ensure that the third transistor M3 is in a turn-off state in the display period. In the blanking period, the fourth clock signal CLKD becomes a low level, and the fourth transistor M4 is turned off. Therefore, the second node N2 can be pulled up to a high level under control of the first clock signal CLKA to turn on the third transistor M3, thereby pulling up the pull-up node Q to a high level. The operation principle of the shift register unit 10 at the timing illustrated in FIG. 13 is basically the same as the operation principle of the shift register unit described above, and is not described here again.

At least one embodiment of the present disclosure also provides a gate driving circuit. The gate driving circuit includes the shift register unit according to any one of the embodiments of the present disclosure. The gate driving circuit has a simple circuit structure, can alleviate the threshold voltage loss in a case where the blanking input circuit performs level control (e.g., pull-up) on the first control node (e.g., the pull-up node) in the blanking period, avoids affecting the potential of the first control node, and thus improves the accuracy of the blanking output signal.

Figure 14:
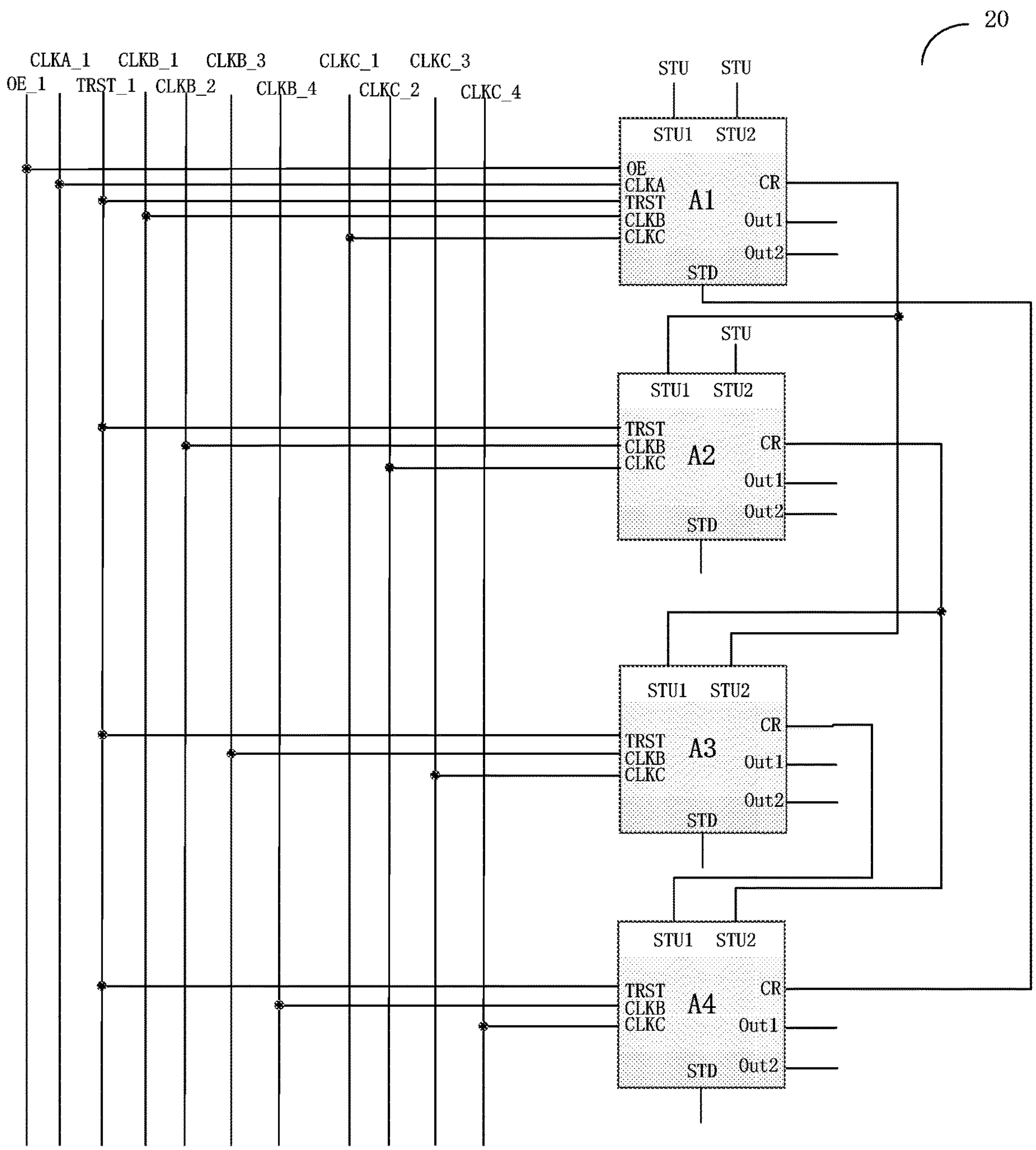
FIG. 14 is a schematic block diagram of a gate driving circuit provided by some embodiments of the present disclosure.

FIG. 14 is a schematic block diagram of a gate driving circuit provided by some embodiments of the present disclosure. Referring to FIG. 14, a gate driving circuit 20 includes a plurality of cascaded shift register units (A1, A2, A3, A4, etc.). The number of the plurality of shift register units is not limited and can be determined according to actual requirements. For example, the shift register unit adopts the shift register unit 10 described in any one of the embodiments of the present disclosure. For example, in the gate driving circuit 20, some or all of the shift register units may adopt the shift register unit 10 described in any one of the embodiments of the present disclosure. For example, the gate driving circuit 20 can be directly integrated on an array substrate of a display device using the same process procedure as that of a thin film transistor to form a gate driver on array (GOA) to realize a progressive scanning driving function.

For example, in some examples, each four shift register units share a same charging sub-circuit 110, a same compensation sub-circuit 120, and a same control sub-circuit 140 to simplify the circuit structure and facilitate the realization of a narrow frame. For example, in a case where the shift register units are implemented as the circuit as illustrated in FIG. 8, each four shift register units share transistors M1, M1_*b*, M1_*c*, M2, M4_*a*, M4_*b* and the first capacitor C1, while each shift register unit includes a third transistor M3 (isolation sub-circuit 130), and a second node N2 is connected to a gate electrode of each third transistor M3 in the four shift register units. In the blanking period, in a case where the second node N2 is at a high level, the four shift register units output blanking output signals at the same time, that is, perform compensation detection at the same time.

Figure 15A:
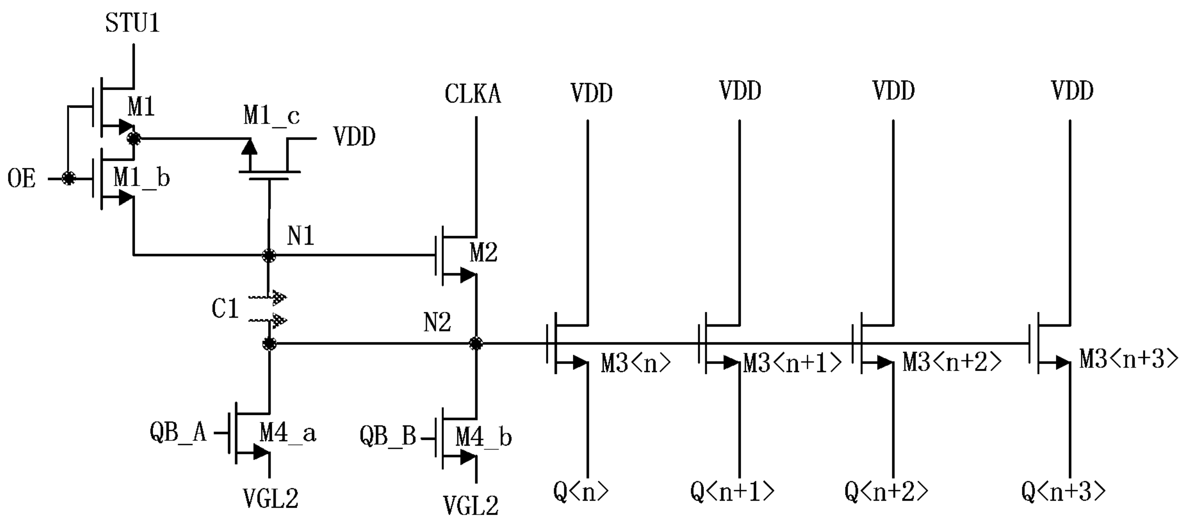
FIGS. 15A-15C are circuit diagrams of specific implementation examples of blanking input circuits of adjacent four shift register units in the gate driving circuit as illustrated in FIG. 14.

For example, referring to FIGS. 14 and 15A, a first shift register unit A1 includes transistors M1, M1_*b*, M1_*c*, M2, M4_*a*, M4_*b*, and a first capacitor C1, and further includes a third transistor M3<n>. A second to a fourth shift register units A2-A4 include third transistors M3<n+1>, M3<n+2>, and M3<n+3>, respectively, and a gate electrode of the third transistor M3<n+1>, a gate electrode of the third transistor M3<n+2> and a gate electrode of the third transistor M3<n+3> are all connected to the second node N2 in the first shift register unit A1. In a case where the second node N2 is at a high level, the third transistors M3<n>, M3<n+1>, M3<n+2>, and M3<n+3> in the four shift register units A1-A4 are all turned on, thereby pulling up the pull-up nodes Q<n>, Q<n+1>, Q<n+2>, and Q<n+3> in the four shift register units A1-A4 to a high level to further output blanking output signals.

Figure 15B:
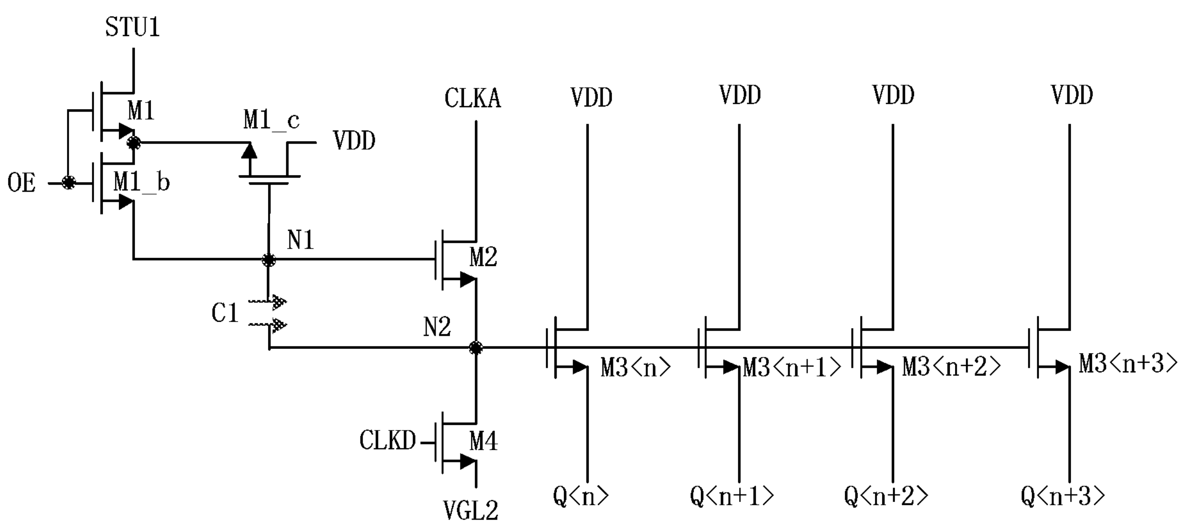
Figure 15C:
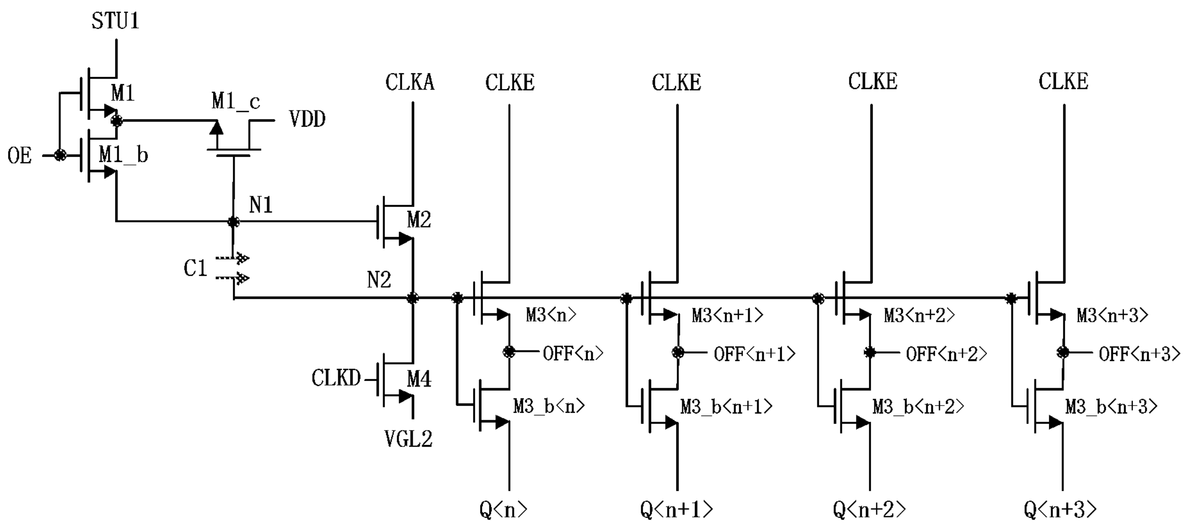

FIG. 15B is a circuit diagram of another implementation example under sharing case. The charging sub-circuit 110, the compensation sub-circuit 120 and the control sub-circuit 140 are implemented as the circuit structure illustrated in FIG. 9A, and other parts are basically the same as the circuit illustrated in FIG. 15A, which are not described here again. FIG. 15C is a circuit diagram of another implementation example in the sharing case. Compared with the example of FIG. 15B, the isolation sub-circuit 130 of each shift register unit adds a leakage prevention circuit to prevent leakage of electricity of the pull-up nodes Q<n>, Q<n+1>, Q<n+2>, and Q<n+3>. In addition, a first electrode of the third transistor M3<n>, a first electrode of the third transistor M3<n+1>, a first electrode of the third transistor M3<n+2>, and a first electrode of the third transistor M3<n+3> of each shift register unit are all connected to a fifth clock signal terminal CLKE to receive a fifth clock signal as the blanking pull-up signal.

It should be noted that in the embodiments of the present disclosure, the number of shift register units sharing the same charging sub-circuit 110, the same compensation sub-circuit 120, and the same control sub-circuit 140 is not limited and may be any value. The above description takes four shift register units sharing the same charging sub-circuit 110, the same compensation sub-circuit 120, and the same control sub-circuit 140 as an example, but the present disclosure is not limited to this case. Furthermore, the plurality of shift register units sharing the above sub-circuits may be adjacent or non-adjacent, and the embodiments of the present disclosure are not limited to this case.

In the gate driving circuit 20 as illustrated in FIG. 14, each four shift register units share the same charging sub-circuit 110, the same compensation sub-circuit 120, and the same control sub-circuit 140, each shared sub-circuit is provided in a (4n−3)th shift register unit, and n is an integer greater than zero. Each shift register unit adopts the circuit structure illustrated in FIG. 8. The specific cascade relationship of the gate driving circuit 20 is described below.

For example, each shift register unit includes a blanking input signal terminal STU1, a display input signal terminal STU2, a display reset signal terminal STD, a shift signal output terminal CR, a first pixel scanning signal output terminal Out1, a second pixel scanning signal output terminal Out2, a blanking reset signal terminal TRST, a second clock signal terminal CLKB, a third clock signal terminal CLKC, etc. The (4n−3)th shift register unit also includes a random signal terminal OE and a first clock signal terminal CLKA. For example, the random signal terminal OE of the (4n−3)th shift register unit is connected to a random signal line OE_1, and the first clock signal terminal CLKA of the (4n−3)th shift register unit is connected to a first clock line CLKA_1. The blanking reset signal terminal TRST of each shift register unit is connected to a blanking reset line TRST_1.

Except for a first shift register unit, a blanking input signal terminal STU1 of an (n+1)th shift register unit is connected to a shift signal output terminal CR of an (n)th shift register unit. Except for the first shift register unit and a second shift register unit, a display input signal terminal STU2 of an (n+2)th shift register unit is connected to a shift signal output terminal CR of the (n)th shift register unit. Except for last three shift register units, a display reset signal terminal STD of the (n)th shift register unit is connected to a shift signal output terminal CR of an (n+3)th shift register unit. For example, a blanking input signal terminal STU1 and a display input signal terminal STU2 of the first shift register unit A1 are connected to a trigger signal line STU, and a display input signal terminal STU2 of the second shift register unit A2 is also connected to the trigger signal line STU. Display reset signal terminals STD of the last three shift register units are connected to a reset signal line provided separately. A first pixel scanning signal output terminal Out1 and a second pixel scanning signal output terminal Out2 of each shift register unit are connected to pixel units in corresponding row to output driving signals to the pixel units in this row.

For example, the gate driving circuit 20 further includes a first sub-clock signal line CLKB_1, a second sub-clock signal line CLKB_2, a third sub-clock signal line CLKB_3, and a fourth sub-clock signal line CLKB_4. The connection mode of each shift register unit and each of the above sub-clock signal lines is described below and so on. A second clock signal terminal CLKB of the (4n−3)th shift register unit is connected to the first sub-clock signal line CLKB_1, a second clock signal terminal CLKB of a (4n−2)th shift register unit is connected to the second sub-clock signal line CLKB_2, a second clock signal terminal CLKB of a (4n−1)th shift register unit is connected to the third sub-clock signal line CLKB_3, and a second clock signal terminal CLKB of a (4n)th shift register unit is connected to the fourth sub-clock signal line CLKB_4.

For example, the gate driving circuit 20 further includes a fifth sub-clock signal line CLKC_1, a sixth sub-clock signal line CLKC_2, a seventh sub-clock signal line CLKC_3, and an eighth sub-clock signal line CLKC_4. The connection mode of each shift register unit and each of the above sub-clock signal lines is described below and so on. A third clock signal terminal CLKC of the (4n−3)th shift register unit is connected to the fifth sub-clock signal line CLKC_1, a third clock signal terminal CLKC of the (4n−2)th shift register unit is connected to the sixth sub-clock signal line CLKC_2, a third clock signal terminal CLKC of the (4n−1)th shift register unit is connected to the seventh sub-clock signal line CLKC_3, and a third clock signal terminal CLKC of the (4n)th shift register unit is connected to the eighth sub-clock signal line CLKC_4.

For example, the gate driving circuit 20 may further include a timing controller T-CON, which is configured to provide the above-mentioned respective clock signals to respective shift register units, for example, and may also be configured to provide the trigger signal and the reset signal. It should be noted that the phase relationship between the plurality of clock signals provided by the timing controller T-CON can be determined according to actual requirements. In different examples, more clock signals may also be provided to the gate driving circuit 20 according to different configurations. For example, the gate driving circuit 20 further includes a plurality of voltage lines to provide a plurality of voltage signals to each shift register unit.

For example, in a case where the gate driving circuit 20 is used to drive a display panel, the gate driving circuit 20 may be disposed on one side of the display panel. For example, the display panel includes a plurality of rows of gate lines, and the first pixel scanning signal output terminal Out1 and the second pixel scanning signal output terminal Out2 of each shift register unit in the gate driving circuit 20 may be configured to be sequentially connected to the plurality of rows of gate lines for outputting driving signals. Of course, the gate driving circuits 20 may also be provided on both sides of the display panel to realize double-sided driving. The arrangement of the gate driving circuit 20 is not limited in the embodiments of the present disclosure.

Figure 16:
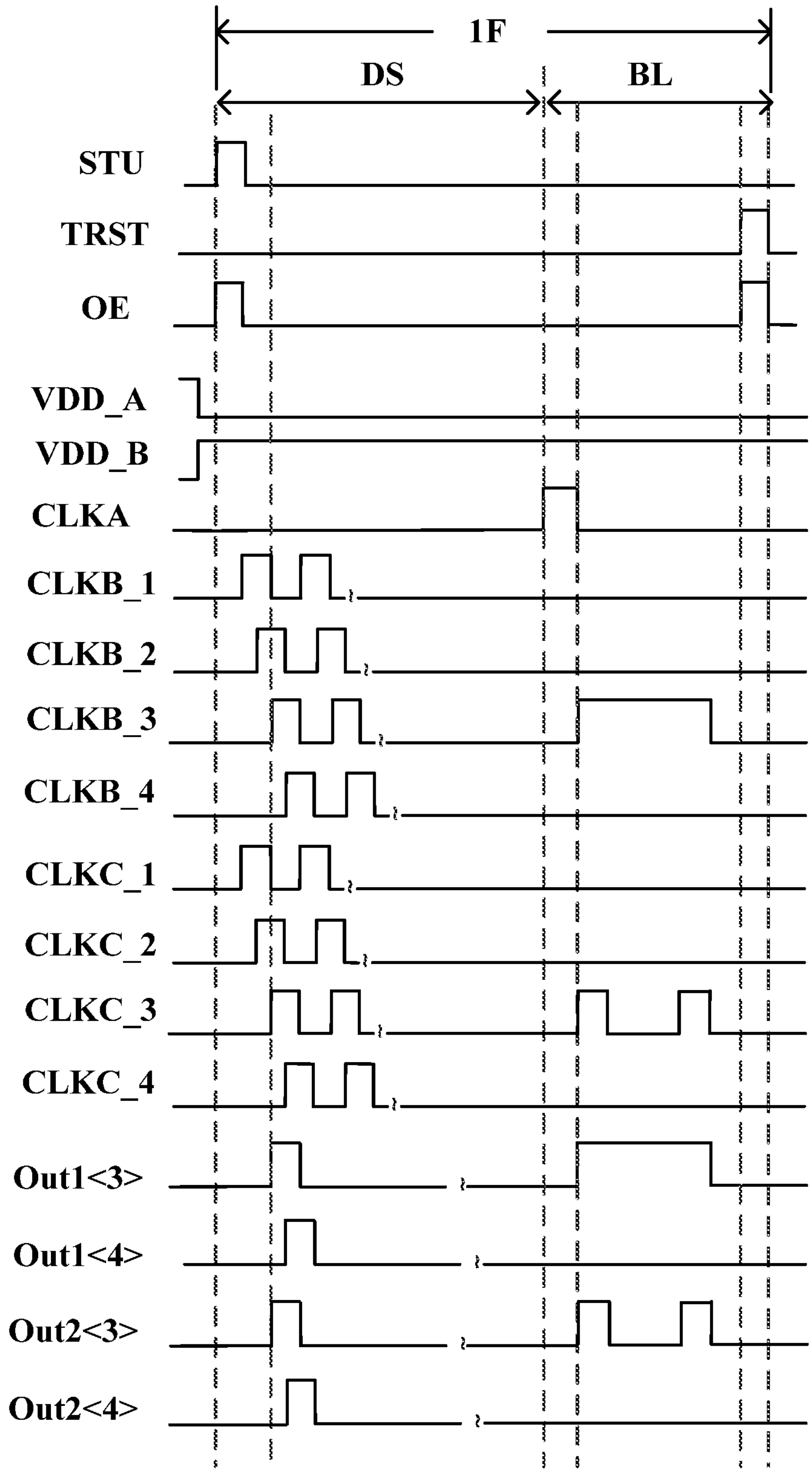
FIG. 16 is a signal timing diagram of a gate driving circuit provided by some embodiments of the present disclosure.

FIG. 16 is a signal timing diagram of a gate driving circuit provided by some embodiments of the present disclosure, and the signal timing diagram is the timing diagram of the gate driving circuit 20 illustrated in FIG. 14. The operation principle of the gate driving circuit 20 may be referred to the corresponding description of the shift register unit 10 in the embodiments of the present disclosure, and is not described here again.

Referring to FIG. 16, a waveform of an output signal Out2 <3> of a second pixel scanning signal output terminal Out2 of the third shift register unit A3 in the display period of one frame is the same as a waveform of an output signal Out1 <3> of a first pixel scanning signal output terminal Out1 of the third shift register unit A3, and a waveform of an output signal Out2<4> of a second pixel scanning signal output terminal Out2 of the fourth shift register units A4 in the display period of one frame is the same as a waveform of an output signal Out1<4> of a first pixel scanning signal output terminal Out1 of the fourth shift register units A4, the waveform of the output signal Out2<3> of the second pixel scanning signal output terminal Out2 of the third shift register unit A3 and the waveform of the output signal Out2<4> of the second pixel scanning signal output terminal Out2 of the fourth shift register units A4 are sequentially shifted in the blanking period of each frame and are different from the waveform of the output signal Out1<3> and the waveform of the output signal Out1<4> of the first pixel scanning signal output terminal Out1, so as to satisfy various application requirements.

For example, a waveform of the first sub-clock signal CLKB_1, a waveform of the second sub-clock signal CLKB_2, a waveform of the third sub-clock signal CLKB_3, and a waveform of the fourth sub-clock signal CLKB_4 in the display period of one frame sequentially overlap 50% of an effective pulse width, and the waveforms in the blanking period of each frame sequentially shift. The waveform of the output signal Out1<3> of the first pixel scanning signal output terminal Out1 of the third shift register unit A3 and the waveform of the output signal Out1<4> of the first pixel scanning signal output terminal Out1 of the fourth shift register unit A4 overlap 50% of the effective pulse width in turn in the display period of one frame, and the waveforms in the blanking period of each frame shift in turn. The output signals of the gate driving circuit 20 in the display period overlap in timing, so that the pre-charge function can be realized, the charging time of the pixel circuit can be shortened, and the high refresh rate can be realized. The waveforms of the fifth to eighth sub-clock signals CLKC_1-CLKC_4 in the display period of one frame sequentially overlap 50% of the effective pulse width, and the waveforms in the blanking period of each frame sequentially shift, so that the output signals of the second pixel scanning signal output terminals Out2 in the display period can also have overlapping portions in timing.

It should be noted that in the embodiments of the present disclosure, the gate driving circuit 20 is not limited to the cascade mode described in FIG. 14, and may be any suitable cascade mode. In a case where the cascade mode or the clock signal changes, the waveform overlapping portion of the output signals of the first pixel scanning signal output terminal Out1 or the second pixel scanning signal output terminal Out2 of each shift register unit may also change correspondingly in the display period, e.g., overlapping 33% or 0% (i.e., non-overlapping), so as to satisfy various application requirements.

At least one embodiment of the present disclosure also provides a display device. The display device comprises the shift register unit according to any one of the embodiments of the present disclosure or the gate driving circuit according to any one of the embodiments of the present disclosure. The circuit structure of the shift register unit or the gate driving circuit in the display device is simple, the threshold voltage loss in a case where the blanking input circuit performs level control (e.g., pull-up) on the first control node (e.g., the pull-up node) in the blanking period can be alleviated, the potential of the first control node is prevented from being influenced, and the accuracy of the blanking output signal is improved.

Figure 17:
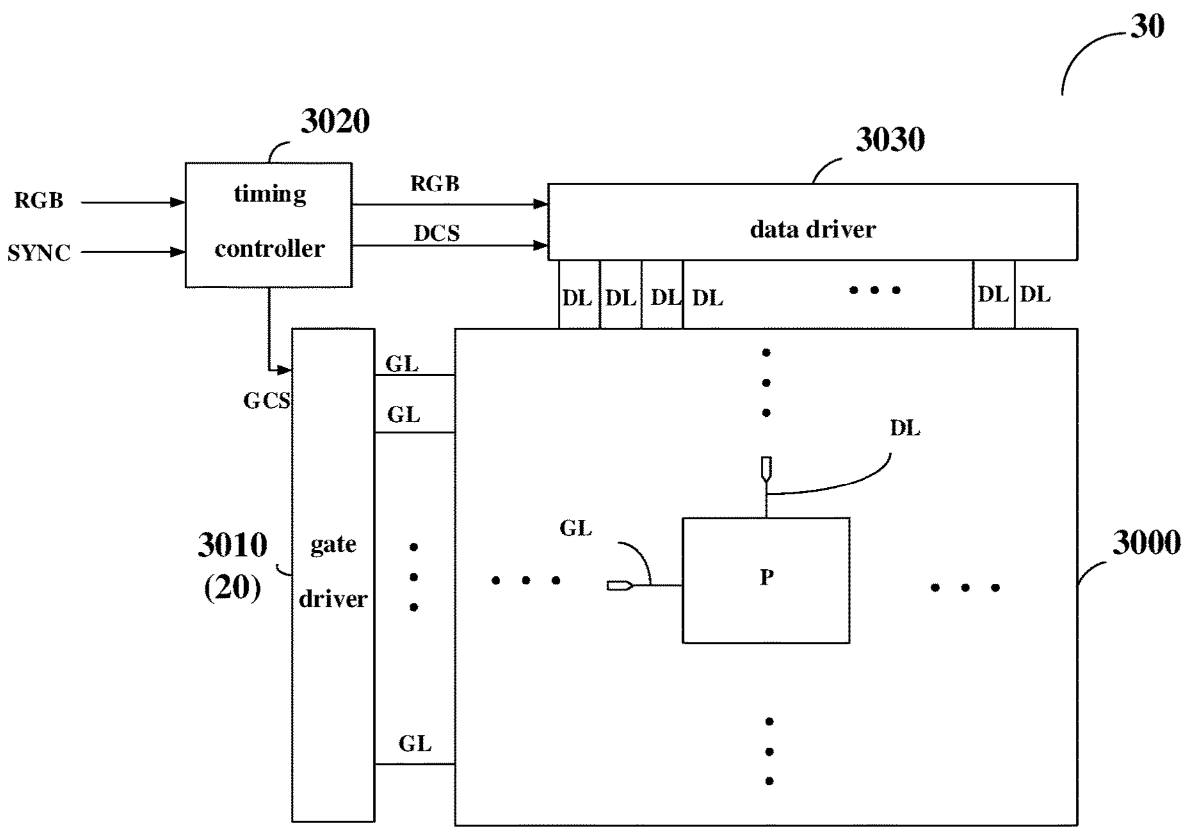
FIG. 17 is a schematic block diagram of a display device provided by some embodiments of the present disclosure.

FIG. 17 is a schematic block diagram of a display device provided by some embodiments of the present disclosure. Referring to FIG. 17, a display device 30 includes a gate driving circuit 20, which is the gate driving circuit according to any one of the embodiments of the present disclosure. For example, the display device 30 may be an OLED display panel, an OLED television, an OLED display, a liquid crystal display panel, a liquid crystal television, or the like, or may be any product or component having a display function, such as an electronic book, a mobile phone, a tablet computer, a notebook computer, a digital photo frame, a navigator, or the like, and the embodiments of the present disclosure are not limited thereto. The technical effect of the display device 30 can be described with reference to the corresponding descriptions of the shift register unit 10 and the gate driving circuit 20 in the above embodiments, and is not described again here.

For example, in some examples, the display device 30 includes a display panel 3000, a gate driver 3010, a timing controller 3020, and a data driver 3030. The display panel 3000 includes a plurality of pixel units P defined according to intersections of a plurality of scanning lines GL and a plurality of data lines DL; the gate driver 3010 is used to drive the plurality of scanning lines GL; the data driver 3030 is used to drive the plurality of data lines DL; and the timing controller 3020 is used to process image data RGB input from outside of the display device 30, supply the image data RGB, which is processed, to the data driver 3030, and output scanning control signals GCS and data control signals DCS to the gate driver 3010 and the data driver 3030 to control the gate driver 3010 and the data driver 3030.

For example, the gate driver 3010 includes the gate driving circuit 20 provided by any one of the above embodiments. The pixel scanning signal output terminals Out of the plurality of shift register units 10 in the gate driving circuit 20 are connected to the plurality of scanning lines GL in correspondence. The plurality of scanning lines GL are correspondingly connected to the pixel units P arranged in a plurality of rows. In the display period, the pixel scanning signal output terminals Out of the respective shift register units 10 in the gate driving circuit 20 sequentially output signals to the plurality of scanning lines GL, so that the plurality of rows of pixel units P in the display panel 3000 can realize the progressive scanning; and in the blanking period, the pixel scanning signal output terminals Out of the respective shift register units 10 in the gate driving circuit 20 randomly output signals to one or more scanning lines GL, so that one or more rows of pixel units P in the display panel 3000 can realize the compensation detection. For example, the gate driver 3010 may be implemented as a semiconductor chip or may be integrated in the display panel 3000 to form a GOA circuit.

For example, the data driver 3030 converts the image data RGB input from the timing controller 3020 into data signals according to the plurality of data control signals DCS originating from the timing controller 3020 using a reference gamma voltage. The data driver 3030 provides data signals, which are converted, to the plurality of data lines DL. For example, the data driver 3030 may be implemented as a semiconductor chip.

For example, the timing controller 3020 processes the image data RGB input from the outside of the display device 30, to match a size and resolution of the display panel 3000, and then supplies the image data, which are processed, to the data driver 3030. The timing controller 3020 generates the plurality of scanning control signals GCS and the plurality of data control signals DCS using synchronization signals (e.g., a dot clock DCLK, a data enable signal DE, a horizontal synchronization signal Hsync, and a vertical synchronization signal Vsync) input from outside of the display device 30. The timing controller 3020 provides the scanning control signals GCS and the data control signals DCS, which are generated, to the gate driver 3010 and the data driver 3030, respectively, for control of the gate driver 3010 and the data driver 3030.

The display device 30 may also include other components, such as a signal decoding circuit, a voltage conversion circuit, etc. These components may, for example, adopt conventional components, which are not described in detail here.

At least one embodiment of the present disclosure also provides a method for driving a shift register unit, and the method can be used to drive the shift register unit provided by any one of the embodiments of the present disclosure. A plurality of the shift register units can be cascaded to form a gate driving circuit, which is used to drive the display panel to display at least one frame of image. Through the method, the threshold voltage loss, in a case where the blanking input circuit performs level control (e.g., pull-up) on the first control node (e.g., the pull-up node) in the blanking period, can be alleviated, the potential of the first control node is prevented from being influenced, and thus the accuracy of the blanking output signal is improved.

For example, in some examples, the method for driving the shift register unit 10 includes a display period and a blanking period for processing one frame of image, the display period includes a first input phase and a first output phase, and the blanking period includes a second input phase and a second output phase. In the above phases, the method for driving the shift register unit 10 includes following operations.

The display period comprises:

in the first input phase, inputting the display pull-up signal to the first control node (e.g., the pull-up node Q) in response to the display input signal by the display input circuit 200; and in the first output phase, outputting the composite output signal to the output terminal OP under control of the level of the first control node (e.g., the pull-up node Q) by the output circuit 300.

The blanking period comprises:

in the second input phase, by the blanking input circuit 100, inputting the blanking pull-up signal to the first control node (e.g., the pull-up node Q), according to the blanking input signal and the blanking control signal, and compensating the blanking input circuit 100; and in the second output phase, outputting the composite output signal to the output terminal OP under control of the level of the first control node (e.g., the pull-up node Q) by the output circuit 300.

It should be noted that the detailed description and technical effects of the method can be referred to the corresponding descriptions of the shift register unit 10 and the gate driving circuit 20 in the embodiments of the present disclosure, which are not repeated here again.

For the present disclosure, the following is to be noted.

(1) The drawings of the embodiments of the present disclosure only relate to the structures relevant to the embodiments of the present disclosure, and other structures may be referred to the general design.

(2) In case of no conflict, the embodiments of the present disclosure and the features in the embodiments can be combined with each other to obtain new embodiments.

What have been described above merely are exemplary embodiments of the present disclosure, and not intended to define the scope of the present disclosure, and the scope of the present disclosure is determined by the appended claims.

What is claimed is:

1. A shift register unit comprising a blanking input circuit, a display input circuit, and an output circuit, wherein the blanking input circuit is configured to, according to a blanking input signal and a blanking control signal, input a blanking pull-up signal to a first control node in a blanking period, and compensate the blanking input circuit;

the display input circuit is configured to input a display pull-up signal to the first control node in a display period in response to a display input signal; and the output circuit is configured to output a composite output signal to an output terminal under control of a level of the first control node, the shift register unit further comprises a noise reduction circuit and a first control circuit, wherein the noise reduction circuit is configured to perform noise reduction on the first control node and the output terminal under control of a level of a second control node; and the first control circuit is configured to control the level of the second control node under control of the level of the first control node, wherein the blanking input circuit comprises:

a charging sub-circuit, configured to input the blanking input signal to a first node in response to the blanking control signal;

a compensation sub-circuit, configured to store the blanking input signal input by the charging sub-circuit, compensate a level of the first node in response to a first clock signal, and perform coupling control on a level of a second node; and an isolation sub-circuit, configured to input the blanking pull-up signal to the first control node under control of the level of the second node.

2. The shift register unit according to claim 1, wherein the blanking input circuit further comprises a control sub-circuit, and the control sub-circuit is configured to control the level of the second node under control of the level of the second control node.

3. The shift register unit according to claim 2, wherein the charging sub-circuit comprises a first transistor, a gate electrode of the first transistor is connected to a random signal terminal to receive a random signal which serves as the blanking control signal, a first electrode of the first transistor is connected to a blanking input signal terminal to receive the blanking input signal, and a second electrode of the first transistor is connected to the first node;

the compensation sub-circuit comprises a second transistor and a first capacitor, a gate electrode of the second transistor is connected to the first node, a first electrode of the second transistor is connected to a first clock signal terminal to receive the first clock signal, a second electrode of the second transistor is connected to the second node, a first electrode of the first capacitor is connected to the first node, and a second electrode of the first capacitor is connected to the second node;

the isolation sub-circuit comprises a third transistor, a gate electrode of the third transistor is connected to the second node, a first electrode of the third transistor is connected to a first voltage terminal to receive a first voltage which serves as the blanking pull-up signal, and a second electrode of the third transistor is connected to the first control node; and the control sub-circuit comprises a fourth transistor, a gate electrode of the fourth transistor is connected to the second control node, a first electrode of the fourth transistor is connected to the second node, and a second electrode of the fourth transistor is connected to a second voltage terminal to receive a second voltage.

4. The shift register unit according to claim 1, wherein the display input circuit comprises a fifth transistor; and a gate electrode of the fifth transistor is connected to a display input signal terminal to receive the display input signal, a first electrode of the fifth transistor is connected to a first voltage terminal to receive a first voltage which serves as the display pull-up signal, and a second electrode of the fifth transistor is connected to the first control node.

5. The shift register unit according to claim 1, wherein the output circuit comprises at least one shift signal output terminal and at least one pixel scanning signal output terminal.

6. The shift register unit according to claim 5, wherein the output circuit comprises a sixth transistor, a seventh transistor, and a second capacitor;

a gate electrode of the sixth transistor is connected to the first control node, a first electrode of the sixth transistor is connected to a second clock signal terminal to receive a second clock signal which serves as the composite output signal, and a second electrode of the sixth transistor is connected to the shift signal output terminal;

a gate electrode of the seventh transistor is connected to the first control node, a first electrode of the seventh transistor is connected to the second clock signal terminal to receive the second clock signal which serves as the composite output signal, and a second electrode of the seventh transistor is connected to the pixel scanning signal output terminal; and a first electrode of the second capacitor is connected to the first control node, and a second electrode of the second capacitor is connected to the second electrode of the sixth transistor or the second electrode of the seventh transistor.

7. The shift register unit according to claim 5, wherein the noise reduction circuit comprises an eighth transistor, a ninth transistor, and a tenth transistor;

a gate electrode of the eighth transistor is connected to the second control node, a first electrode of the eighth transistor is connected to the first control node, and a second electrode of the eighth transistor is connected to a third voltage terminal to receive a third voltage;

a gate electrode of the ninth transistor is connected to the second control node, a first electrode of the ninth transistor is connected to the shift signal output terminal, and a second electrode of the ninth transistor is connected to the third voltage terminal to receive the third voltage; and a gate electrode of the tenth transistor is connected to the second control node, a first electrode of the tenth transistor is connected to the pixel scanning signal output terminal, and a second electrode of the tenth transistor is connected to a fourth voltage terminal to receive a fourth voltage.

8. The shift register unit according to claim 1, wherein the first control circuit comprises an eleventh transistor, a twelfth transistor, and a thirteenth transistor;

a gate electrode of the eleventh transistor is connected to a first electrode of the eleventh transistor, and is connected to a fifth voltage terminal to receive a fifth voltage, and a second electrode of the eleventh transistor is connected to the second control node;

a gate electrode of the twelfth transistor is connected to a first electrode of the twelfth transistor, and is connected to a sixth voltage terminal to receive a sixth voltage, and a second electrode of the twelfth transistor is connected to the second control node; and a gate electrode of the thirteenth transistor is connected to the first control node, a first electrode of the thirteenth transistor is connected to the second control node, and a second electrode of the thirteenth transistor is connected to a third voltage terminal to receive a third voltage.

9. The shift register unit according to claim 1, further comprising a blanking reset circuit, wherein the blanking reset circuit is configured to reset the first control node in response to a blanking reset signal.

10. The shift register unit according to claim 9, wherein the blanking reset circuit comprises a fourteenth transistor; and a gate electrode of the fourteenth transistor is connected to a blanking reset signal terminal to receive the blanking reset signal, a first electrode of the fourteenth transistor is connected to the first control node, and a second electrode of the fourteenth transistor is connected to a third voltage terminal to receive a third voltage.

11. The shift register unit according to claim 1, further comprising a display reset circuit, wherein the display reset circuit is configured to reset the first control node in response to a display reset signal.

12. The shift register unit according to claim 11, wherein the display reset circuit comprises a fifteenth transistor; and a gate electrode of the fifteenth transistor is connected to a display reset signal terminal to receive the display reset signal, a first electrode of the fifteenth transistor is connected to the first control node, and a second electrode of the fifteenth transistor is connected to a third voltage terminal to receive a third voltage.

13. The shift register unit according to claim 1, further comprising a second control circuit, wherein the second control circuit is configured to control the level of the second control node in response to the first clock signal or the display input signal.

14. The shift register unit according to claim 13, wherein the second control circuit comprises a sixteenth transistor and a seventeenth transistor;

a gate electrode of the sixteenth transistor is connected to a first clock signal terminal to receive the first clock signal, a first electrode of the sixteenth transistor is connected to the second control node, and a second electrode of the sixteenth transistor is configured to receive a third voltage of a third voltage terminal; and a gate electrode of the seventeenth transistor is connected to a display input signal terminal to receive the display input signal, a first electrode of the seventeenth transistor is connected to the second control node, and a second electrode of the seventeenth transistor is connected to the third voltage terminal to receive the third voltage.

15. A gate driving circuit, comprising the shift register unit according to claim 1.

16. The gate driving circuit according to claim 15, wherein each four shift register units share a same charging sub-circuit, a same compensation sub-circuit, and a same control sub-circuit, a random signal terminal of a (4n−3)th shift register unit is connected to a random signal line, a first clock signal terminal of the (4n−3)th shift register unit is connected to a first clock line, and n is an integer greater than zero.

17. A display device, comprising the shift register unit according to claim 1.

18. A method for driving the shift register unit according to claim 1, comprising the display period and the blanking period for processing one frame of image, wherein the display period comprises:

in a first input phase, inputting the display pull-up signal to the first control node in response to the display input signal by the display input circuit; and in a first output phase, outputting the composite output signal to the output terminal under control of the level of the first control node by the output circuit, and the blanking period comprises:

in a second input phase, by the blanking input circuit, inputting the blanking pull-up signal to the first control node, according to the blanking input signal and the blanking control signal, and compensating the blanking input circuit; and in a second output phase, outputting the composite output signal to the output terminal under control of the level of the first control node by the output circuit.

* * * * *